United States Patent
Noh et al.

(10) Patent No.: US 10,741,697 B2
(45) Date of Patent: Aug. 11, 2020

(54) THIN FILM TRANSISTOR HAVING SUPPORTING LAYER, METHOD FOR MANUFACTURING THE SAME AND DISPLAY DEVICE COMPRISING THE SAME

(71) Applicant: LG Display Co., Ltd., Seoul (KR)

(72) Inventors: Jiyong Noh, Paju-si (KR); Jaeman Jang, Paju-si (KR); JuHeyuck Baeck, Paju-si (KR); PilSang Yun, Paju-si (KR)

(73) Assignee: LG Display Co., Ltd., Seoul (KR)

(*) Notice: Subject to any disclaimer, the term of this patent is extended or adjusted under 35 U.S.C. 154(b) by 28 days.

(21) Appl. No.: 16/211,151

(22) Filed: Dec. 5, 2018

(65) Prior Publication Data
US 2019/0181274 A1    Jun. 13, 2019

(30) Foreign Application Priority Data

Dec. 11, 2017    (KR) .................... 10-2017-0169696

(51) Int. Cl.
*H01L 29/786* (2006.01)
*H01L 29/24* (2006.01)
(Continued)

(52) U.S. Cl.
CPC .. *H01L 29/78696* (2013.01); *H01L 21/02422* (2013.01); *H01L 21/02472* (2013.01);
(Continued)

(58) Field of Classification Search
CPC .......... H01L 29/7869; H01L 29/78696; H01L 21/02422; H01L 21/02472;
(Continued)

(56) References Cited

U.S. PATENT DOCUMENTS

| 8,466,465 B2 * | 6/2013 | Jeong ............... H01L 29/78696 257/57 |
| 8,629,496 B2 * | 1/2014 | Yamazaki ......... H01L 21/02422 257/335 |

(Continued)

FOREIGN PATENT DOCUMENTS

| KR | 10-0975204 B | 8/2010 |
| KR | 10-1671952 B | 11/2016 |

*Primary Examiner* — Earl N Taylor
(74) *Attorney, Agent, or Firm* — Fenwick & West LLP

(57) ABSTRACT

A thin film transistor is provided. The thin film transistor includes an oxide semiconductor layer on a substrate, a gate electrode insulated from the oxide semiconductor layer to overlap at least a portion of the oxide semiconductor layer, a source electrode connected to the oxide semiconductor layer, and a drain electrode spaced apart from the source electrode and connected to the oxide semiconductor layer. The oxide semiconductor layer includes a first oxide semiconductor layer on the substrate and a second oxide semiconductor layer on the first oxide semiconductor layer, the first oxide semiconductor layer includes nitrogen of 1 at % to 5 at % concentration with respect to number of atoms, and the second oxide semiconductor layer has a nitrogen concentration which is lower than a nitrogen concentration of the first oxide semiconductor layer and a gradient of the nitrogen concentration such that the nitrogen concentration is lowered in a direction closer to the gate electrode.

21 Claims, 13 Drawing Sheets

(51) Int. Cl.
*H01L 29/66* (2006.01)
*H01L 21/02* (2006.01)
*H01L 21/38* (2006.01)
*G02F 1/1368* (2006.01)
*H01L 27/32* (2006.01)

(52) U.S. Cl.
CPC .. *H01L 21/02483* (2013.01); *H01L 21/02491* (2013.01); *H01L 21/02505* (2013.01); *H01L 21/02554* (2013.01); *H01L 21/02565* (2013.01); *H01L 21/02631* (2013.01); *H01L 29/247* (2013.01); *H01L 29/66969* (2013.01); *H01L 29/78693* (2013.01); *G02F 1/1368* (2013.01); *G02F 2001/13685* (2013.01); *H01L 21/02488* (2013.01); *H01L 21/02592* (2013.01); *H01L 21/38* (2013.01); *H01L 27/3244* (2013.01); *H01L 29/78633* (2013.01)

(58) Field of Classification Search
CPC ......... H01L 21/02483; H01L 21/02491; H01L 21/02505; H01L 21/02554; H01L 21/02565; H01L 21/02631; H01L 29/247; H01L 29/66969; H01L 29/78693; G02F 1/1368

See application file for complete search history.

(56) References Cited

U.S. PATENT DOCUMENTS

| | | | |
|---|---|---|---|
| 8,785,265 B2* | 7/2014 | Yamazaki | H01L 21/02422 257/335 |
| 9,620,592 B2* | 4/2017 | de Souza | H01L 29/78 |
| 2012/0132903 A1* | 5/2012 | Yamazaki | H01L 21/02565 257/43 |
| 2012/0132904 A1* | 5/2012 | Yamazaki | H01L 21/02422 257/43 |
| 2012/0132905 A1* | 5/2012 | Yamazaki | H01L 29/4908 257/43 |
| 2014/0087516 A1* | 3/2014 | Yamazaki | H01L 21/02422 438/104 |
| 2017/0170332 A1* | 6/2017 | Yamazaki | H01L 29/78696 |
| 2017/0243759 A1* | 8/2017 | Jintyou | H01L 21/0214 |
| 2019/0181274 A1* | 6/2019 | Noh | H01L 29/247 |

* cited by examiner

THIN FILM TRANSISTOR HAVING SUPPORTING LAYER, METHOD FOR MANUFACTURING THE SAME AND DISPLAY DEVICE COMPRISING THE SAME

TECHNICAL FIELD

The present disclosure relates to a thin film transistor including a supporting layer, a method of manufacturing the thin film transistor, and a display apparatus including the thin film transistor.

BACKGROUND ART

Transistors are being widely used as switching devices or driving devices in the field of electronic devices. Particularly, thin film transistors (TFTs) may be manufactured on a glass substrate or a plastic substrate, and thus, are being widely used as switching devices for display apparatuses such as liquid crystal display (LCD) devices and organic light emitting devices.

TFTs may be categorized into amorphous silicon TFTs where amorphous silicon is used as an active layer, polycrystalline silicon TFTs where polycrystalline silicon is used as an active layer, and oxide semiconductor TFTs where an oxide semiconductor is used as an active layer, with respect to a material included in an active layer.

In oxide semiconductor TFTs, oxide included in an active layer may form a layer at a relatively low temperature, mobility may be high, a large resistance variation may occur based on a content of oxygen, and desired physical properties may be obtained easily. Also, since an oxide semiconductor is transparent in terms of a characteristic of oxide, the oxide semiconductor TFTs may be easily used to implement transparent display apparatuses.

A high-mobility oxide semiconductor layer has a carrier concentration of $10^{18}/cm^3$ or more, and thus, when the high-mobility oxide semiconductor layer has a thickness of 10 nm or more, the high-mobility oxide semiconductor layer may have the same characteristic as that of a conductor. In order to prevent the high-mobility oxide semiconductor layer from becoming conductive, the high-mobility oxide semiconductor layer may be manufactured to have a thickness of less than 10 nm and may be applied to TFTs. In this case, however, due to a thin thickness, an oxide semiconductor layer may be damaged or swept away in a patterning process.

DISCLOSURE

Technical Problem

An aspect of the present disclosure is directed to providing a thin film transistor (TFT) including an oxide semiconductor layer having a structure where a supporting layer including nitrogen supports a channel layer.

Another aspect of the present disclosure is directed to providing a method of manufacturing a TFT, which includes a process of forming a supporting layer including nitrogen.

Another aspect of the present disclosure is directed to providing a display apparatus including a TFT.

Technical Solution

To achieve these and other advantages and in accordance with the purpose of the disclosure, as embodied and broadly described herein, there is provided a thin film transistor (TFT) including an oxide semiconductor layer on a substrate, a gate electrode insulated from the oxide semiconductor layer to overlap at least a portion of the oxide semiconductor layer, a source electrode connected to the oxide semiconductor layer, and a drain electrode spaced apart from the source electrode and connected to the oxide semiconductor layer, wherein the oxide semiconductor layer includes a first oxide semiconductor layer on the substrate and a second oxide semiconductor layer on the first oxide semiconductor layer, the first oxide semiconductor layer includes nitrogen of 1 at % to 5 at % concentration with respect to number of atoms, and the second oxide semiconductor layer has a nitrogen concentration which is lower than a nitrogen concentration of the first oxide semiconductor layer and a gradient of the nitrogen concentration such that the nitrogen concentration is lowered in a direction closer to the gate electrode.

The first oxide semiconductor layer may have a thickness of 3 nm to 50 nm.

The second oxide semiconductor layer may have a thickness of 5 nm to 30 nm.

The first oxide semiconductor layer and the second oxide semiconductor layer may be amorphous.

Each of the first oxide semiconductor layer and the second oxide semiconductor layer may include an indium (In)-nitrogen (N) bond, a ratio of an In—N bond in the first oxide semiconductor layer may be higher than a ratio of an In—N bond in the second oxide semiconductor layer, the ratio of the In—N bond in the first oxide semiconductor layer may denote a ratio of elements bonded to N among In elements included in the first oxide semiconductor layer, and the ratio of the In—N bond in the second oxide semiconductor layer may denote a ratio of elements bonded to N among In elements included in the second oxide semiconductor layer.

The TFT may further include a light blocking layer on the substrate and a buffer layer on the light blocking layer, wherein the light blocking layer may overlap the oxide semiconductor layer.

In another aspect of the present disclosure, there is provided a method of manufacturing a thin film transistor (TFT), the method including forming an oxide semiconductor layer on a substrate, forming a gate electrode which is insulated from the oxide semiconductor layer and overlaps at least a portion of the oxide semiconductor layer, forming a source electrode and a drain electrode each connected to the oxide semiconductor layer and spaced apart from each other, wherein the forming of the oxide semiconductor layer includes forming a first oxide semiconductor material layer on the substrate through a sputtering deposition process with oxygen gas and a nitrogen gas provided in a chamber, forming a second oxide semiconductor material layer on the first oxide semiconductor material layer through a sputtering deposition process with oxygen gas provided in the chamber, and patterning the first oxide semiconductor material layer and the second oxide semiconductor material layer to form a first oxide semiconductor layer and a second oxide semiconductor layer, the first oxide semiconductor layer including nitrogen of 1 at % to 5 at % concentration with respect to number of atoms, and the second oxide semiconductor layer having a nitrogen concentration which is lower than a nitrogen concentration of the first oxide semiconductor layer and a gradient of the nitrogen concentration such that the nitrogen concentration is lowered in a direction closer to the gate electrode.

The forming of the first oxide semiconductor material layer may include supplying an argon gas, an oxygen gas, and a nitrogen gas to the chamber, and a flow rate of the nitrogen gas supplied to the chamber may be 1% to 50% of a flow rate of all gases supplied to the chamber.

The first oxide semiconductor layer may be formed to have a thickness of 3 nm to 50 nm.

The second oxide semiconductor layer may be formed to have a thickness of 5 nm to 30 nm.

The method may further include, before the forming of the oxide semiconductor layer, forming a light blocking layer on the substrate and forming a buffer layer on the light blocking layer.

In another aspect of the present disclosure, there is provided a display apparatus including a substrate, the above-described TFT on the substrate, and a first electrode connected to the TFT.

Advantageous Effects

In the oxide semiconductor layer of the TFT according to the embodiments of the present disclosure, a first oxide semiconductor layer which is a supporting layer including nitrogen may support a second oxide semiconductor layer which is a channel layer, and thus, the first and second oxide semiconductor layers may have good stability in process and driving. Also, some nitrogen included in the first oxide semiconductor layer which is the supporting layer may move to the second oxide semiconductor layer which is an active layer, and thus, the second oxide semiconductor layer may be stabilized, whereby the second oxide semiconductor layer may be manufactured to have a thin thickness of less than 10 nm or a thick thickness of 10 nm or more. Accordingly, a thickness of the second oxide semiconductor layer may be variously set.

The TFT including the oxide semiconductor layers according to the embodiments of the present disclosure may have good stability in driving, and a display apparatus including the TFT may have excellent reliability and display characteristic.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

DETAILED DESCRIPTION OF EMBODIMENTS OF INVENTION

Figure 1:
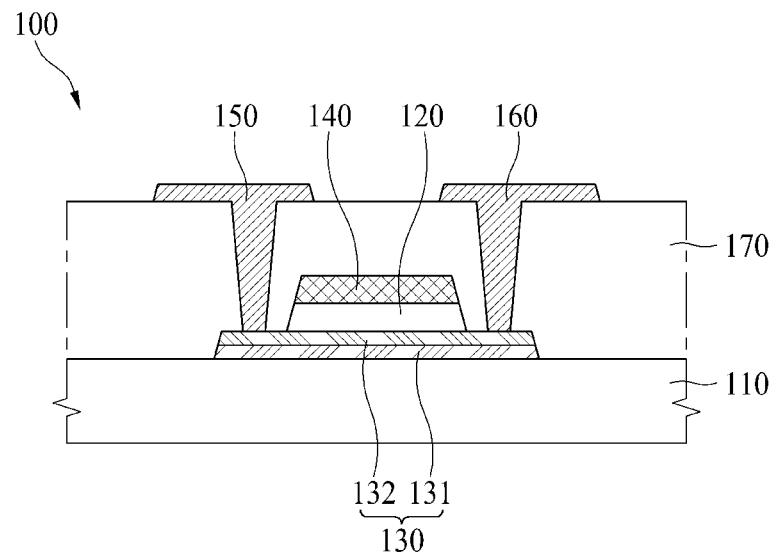
FIG. 1 is a cross-sectional view of a TFT according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

Spatially relative terms "below", "beneath", "lower", "above", and "upper" may be used herein for easily describing a relationship between one device or elements and other devices or elements as illustrated in the drawings. It should be understood that spatially relative terms are intended to encompass different orientations of the device in addition to the orientation depicted in the drawings. For example, if a device in the drawings is turned over, elements described as being on the "below" or "beneath" sides of other elements may be placed on "above" sides of the other elements. The exemplary term "lower" may encompass both orientations of "lower" and "upper". Likewise, the exemplary term "above" or "upper" may encompass both orientations of above and below.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a thin film transistor (TFT), a method of manufacturing the same, and a display apparatus including the TFT according to embodiments of the present disclosure will be described in detail with reference to the accompanying drawings. In the specification, in adding reference numerals for elements in each drawing, it should be noted that like reference numerals already used to denote like elements in other drawings are used for elements wherever possible.

FIG. 1 is a cross-sectional view of a TFT 100 according to an embodiment of the present disclosure.

The TFT 100 according to an embodiment of the present disclosure may include an oxide semiconductor layer 130 on a substrate 110, a gate electrode 140 which is insulated from the oxide semiconductor layer 130 and overlaps at least a portion of the oxide semiconductor layer 130, a source electrode 150 connected to the oxide semiconductor layer 130, and a drain electrode 160 which is spaced apart from the source electrode 150 and is connected to the oxide semiconductor layer 130.

Glass or plastic may be used as the substrate 110. Transparent plastic, for example, polyimide having a flexible characteristic may be used as plastic.

Although not shown, a buffer layer may be disposed on the substrate 110. The buffer layer may be good in insulation and planarization characteristics and may protect the oxide semiconductor layer 130.

The oxide semiconductor layer 130 may be disposed on the substrate 110. The oxide semiconductor layer 130 may include a first oxide semiconductor layer 131 on the substrate 110 and a second oxide semiconductor layer 132 on the first oxide semiconductor layer 131.

The first oxide semiconductor layer 131 may support the second oxide semiconductor layer 132. Therefore, the first oxide semiconductor layer 131 may be referred to as a supporting layer. The first oxide semiconductor layer 131 may include an oxide semiconductor material and nitrogen (N). For example, the first oxide semiconductor layer 131 may include nitrogen (N) and an oxide semiconductor material such as IZO (InZnO), IGO (InGaO), ITO (InSnO), IGZO (InGaZnO), IGZTO (InGaZnSnO), GZTO (GaZnSnO), GZO (GaZnO), or ITZO (InSnZnO).

The first oxide semiconductor layer 131 may include nitrogen. Nitrogen included in the first oxide semiconductor layer 131 may form a stable bond with oxygen and may be stably disposed between metals. Also, nitrogen may be disposed at an oxygen vacancy (VO) site of the first oxide semiconductor layer 131 and may fill a defect site. When the VO site is filled with nitrogen, oxygen vacancy may be reduced, and an etchant and the like may be prevented from penetrating into the VO site while a process is being performed. In this manner, the first oxide semiconductor layer 131 including nitrogen may be good in film stability and may be good in resistance to processes such as an exposure process, an etching process, a patterning process, and thermal treatment each performed for manufacturing the TFT 100, thereby supporting the second oxide semiconductor layer 132 which is a channel layer.

According to an embodiment of the present disclosure, the first oxide semiconductor layer 131 may include nitrogen of 1 at % to 5 at % concentration with respect to the number of atoms. When a concentration of nitrogen included in the first oxide semiconductor layer 131 is less than 1 at %, a defect site of the first oxide semiconductor layer 131 may not sufficiently be filled, and due to this, film stability may not sufficiently be secured and the first oxide semiconductor layer 131 may not sufficiently support the second oxide semiconductor layer 132. Also, when a concentration of nitrogen included in the first oxide semiconductor layer 131 is less than 1 at %, oxygen vacancy may not sufficiently be removed, and due to this, since the number of carriers of a channel increases, it may be difficult to control a threshold voltage (Vth) of the TFT 100 and a leakage current may occur in an off state.

On the other hand, when a concentration of nitrogen included in the first oxide semiconductor layer 131 is more than 5 at %, some nitrogen may be in a non-bound state, the film quality of the first oxide semiconductor layer 131 may be reduced, and due to this, the first oxide semiconductor layer 131 may not sufficiently support the second oxide semiconductor layer 132. Also, when a concentration of nitrogen included in the first oxide semiconductor layer 131 is more than 5 at %, an undesired amount of nitrogen may flow into the second oxide semiconductor layer 132, and due to this, a mobility of the second oxide semiconductor layer 132 may be reduced and thus an on-current of the TFT 100 may decrease, causing a reduction in performance of the TFT 100.

The first oxide semiconductor layer 131 may be formed through a sputtering deposition process. For example, the first oxide semiconductor layer 131 may be formed through the sputtering deposition process using an oxide semiconductor material, an oxygen gas, and a nitrogen gas. Therefore, the first oxide semiconductor layer 131 may include nitrogen (see FIG. 4A).

Since the first oxide semiconductor layer 131 is formed through the sputtering deposition process, nitrogen may be distributed in a whole region of the first oxide semiconductor layer 131. Since nitrogen is distributed in a whole region of the first oxide semiconductor layer 131, the first oxide semiconductor layer 131 may be good in film stability.

According to an embodiment of the present disclosure, the first oxide semiconductor layer 131 may have a thickness of 3 nm to 50 nm. When a thickness of the first oxide semiconductor layer 131 is less than 3 nm, nitrogen and other elements may not smoothly be bonded to each other in the first oxide semiconductor layer 131, and due to this, nitrogen may not sufficiently fill a defect site and thus a physical thickness for supporting the second oxide semiconductor layer 132 may not be secured, whereby the first oxide semiconductor layer 131 may not normally support the second oxide semiconductor layer 132.

On the other hand, when a thickness of the first oxide semiconductor layer 131 is more than 50 nm, the amount of nitrogen included in the first oxide semiconductor layer 131 may be large, and thus, the amount of nitrogen diffused to the second oxide semiconductor layer 132 may increase.

Therefore, a carrier concentration of the second oxide semiconductor layer 132 may be reduced, and thus, an on-current and mobility of the TFT 100 may be reduced, causing a reduction in performance of the TFT 100. Also, when a thickness of the first oxide semiconductor layer 131 is 50 nm, the first oxide semiconductor layer 131 may sufficiently support the second oxide semiconductor layer 132, but when a thickness of the first oxide semiconductor layer 131 is more than 50 nm, the material cost may increase, causing an increase in the process cost. However, an embodiment of the present disclosure is not limited thereto, and depending on the case, the first oxide semiconductor layer 131 may have a thickness of more than 50 nm. The first oxide semiconductor layer 131 may have a thickness of 50 nm to 100 nm.

A channel of the TFT 100 may be provided in the second oxide semiconductor layer 132. Therefore, the second oxide semiconductor layer 132 may be referred to as a channel layer. The second oxide semiconductor layer 132 may include an oxide semiconductor material. For example, the second oxide semiconductor layer 132 may include an oxide semiconductor material such as IZO (InZnO), IGO (InGaO), ITO (InSnO), IGZO (InGaZnO), IGZTO (InGaZnSnO), GZTO (GaZnSnO), GZO (GaZnO), or ITZO (InSnZnO). According to an embodiment of the present disclosure, the second oxide semiconductor layer 132 may include an indium-based oxide semiconductor material including indium (In). However, an embodiment of the present disclosure is not limited thereto, and the second oxide semiconductor layer 132 may include another oxide semiconductor material known to those skilled in the art.

The second oxide semiconductor layer 132 may include the same material as that of the first oxide semiconductor layer 131. For example, the first oxide semiconductor layer 131 and the second oxide semiconductor layer 132 may each include the same semiconductor material.

The second oxide semiconductor layer 132 may be formed through a sputtering deposition process. For example, the second oxide semiconductor layer 132 may be formed through the sputtering deposition process using an oxide semiconductor material and an oxygen gas (see FIG. 4B).

According to an embodiment of the present disclosure, the first oxide semiconductor layer 131 and the second oxide semiconductor layer 132 may each include an amorphous layer. Since atoms or molecules are capable of moving in an amorphous layer, nitrogen included in the first oxide semiconductor layer 131 may be diffused to the second oxide semiconductor layer 132, and thus, the second oxide semiconductor layer 132 may include nitrogen. For example, the second oxide semiconductor layer 132 may include nitrogen of 1 at % or less. In more detail, the first oxide semiconductor layer 131 may include nitrogen of 0.1 at % to 1 at %.

According to an embodiment of the present disclosure, nitrogen of the first oxide semiconductor layer 131 may flow into the second oxide semiconductor layer 132 without directly injecting nitrogen into the second oxide semiconductor layer 132 through a sputtering process, and thus, nitrogen may be doped on the second oxide semiconductor layer 132. In a case where nitrogen is directly doped on the second oxide semiconductor layer 132 by forming nitrogen-containing oxide through a sputtering process or the like, it is not easy to finely control a content of doped nitrogen. Particularly, it is required that the second oxide semiconductor layer 132 according to an embodiment of the present disclosure may include nitrogen of 1 at % or less, but even in a case where the second oxide semiconductor layer 132 is formed by using a small amount of nitrogen in a manufacturing process, an undesired amount of nitrogen (for example, nitrogen of more than 1 at %) may be included in the second oxide semiconductor layer 132. In this case, a carrier concentration of the second oxide semiconductor layer 132 may be reduced, an on-current of the TFT 100 may be reduced, and mobility may be reduced, causing a reduction in performance of the TFT 100.

Therefore, according to an embodiment of the present disclosure, the second oxide semiconductor layer 132 acting as a channel layer may be manufactured in a state where nitrogen is not supplied, and then, nitrogen may be diffused from the first oxide semiconductor layer 131 to the second oxide semiconductor layer 132, thereby allowing the second oxide semiconductor layer 132 to be doped with nitrogen. As a result, the second oxide semiconductor layer 132 may include nitrogen of 0.1 at % or more. When the second oxide semiconductor layer 132 includes nitrogen of 0.1 at % or more, nitrogen may fill an oxygen vacancy of the second oxide semiconductor layer 132, a carrier concentration of the second oxide semiconductor layer 132 may be controlled, thereby enhancing the film stability of the second oxide semiconductor layer 132.

The second oxide semiconductor layer 132 including nitrogen diffused from the first oxide semiconductor layer 131 may have a nitrogen concentration which is lower than that of the first oxide semiconductor layer 131 and may have a gradient of a nitrogen concentration such that the nitrogen concentration is lowered in a direction closer to the gate electrode 140. Also, nitrogen of a region adjacent to the second oxide semiconductor layer 132 may move to the first oxide semiconductor layer 131, and thus, the first oxide semiconductor layer 131 may have a gradient of a nitrogen concentration. For example, the first oxide semiconductor layer 131 may have a gradient of a nitrogen concentration such that the nitrogen concentration is lowered in a direction toward the gate electrode 140. Since each of the first oxide semiconductor layer 131 and the second oxide semiconductor layer 132 has a gradient of a nitrogen concentration, the oxide semiconductor layer 130 may wholly have a gradient of a nitrogen concentration such that the nitrogen concentration is lowered in a direction toward the gate electrode 140.

Since the second oxide semiconductor layer 132 includes nitrogen, a mobility of the second oxide semiconductor layer 132 may be reduced. Accordingly, even when the second oxide semiconductor layer 132 has a thickness of 10 nm or more, the second oxide semiconductor layer 132 may not have a conductive characteristic.

Moreover, since the second oxide semiconductor layer 132 is supported by the first oxide semiconductor layer 131 and includes nitrogen, and the second oxide semiconductor layer 132 may be good in film stability. Therefore, even when the second oxide semiconductor layer 132 has a thin thickness of less than 10 nm, the second oxide semiconductor layer 132 may not be swept away in an etching or patterning process for manufacturing the TFT 100, and a defect may not occur in the second oxide semiconductor layer 132.

According to an embodiment of the present disclosure, a thickness of the second oxide semiconductor layer 132 is not limited thereto. However, the second oxide semiconductor layer 132 may have a thickness of 5 nm to 50 nm for acting as a channel layer. For example, when the second oxide semiconductor layer 132 includes a high-mobility material such as IZO, the second oxide semiconductor layer 132 may have a thickness of 3 nm to 30 nm. When the second oxide semiconductor layer 132 includes a material such as IGZO, the second oxide semiconductor layer 132 may have a thickness of 5 nm to 50 nm. Generally, when a thickness of the second oxide semiconductor layer 132 is less than 3 nm, the second oxide semiconductor layer 132 may be difficult to act as a channel layer, and the second oxide semiconductor layer 132 may be damaged in the etching or patterning process, causing a reduction in processability. On the other hand, when a thickness of the second oxide semiconductor layer 132 is more than 50 nm, the amount of consumed material may increase, causing an increase in the manufacturing cost.

According to an embodiment of the present disclosure, each of the first oxide semiconductor layer 131 and the second oxide semiconductor layer 132 may include indium. It has been known that indium enhances a mobility of the oxide semiconductor layer 130 and increases a carrier concentration, and thus, the oxide semiconductor layer 133 may be widely used. However, when the oxide semiconductor layer 130 includes indium of 50 at % or more with respect to a total content, an oxygen vacancy or the amount of hydrogen (H) flowing into a channel region may increase, and due to this, the oxide semiconductor layer 130 may have a function similar to that of a conductor.

According to an embodiment of the present disclosure, at least some indium included in each of the first oxide semiconductor layer 131 and the second oxide semiconductor layer 132 may be bonded to nitrogen, and thus, a carrier concentration may be reduced, thereby preventing the first oxide semiconductor layer 131 and the second oxide semiconductor layer 132 from having a conductive characteristic.

Particularly, the first oxide semiconductor layer 131 and the second oxide semiconductor layer 132 may be prevented from having a conductive characteristic in a channel region which is a region overlapping the gate electrode 140.

According to an embodiment of the present disclosure, each of the first oxide semiconductor layer 131 and the second oxide semiconductor layer 132 may include an In—N bond. A concentration of nitrogen included in the first oxide semiconductor layer 131 may be higher than that of nitrogen included in the second oxide semiconductor layer 132, indium of the first oxide semiconductor layer 131 may be bonded to nitrogen at a ratio which is higher than indium of the second oxide semiconductor layer 132.

For example, a ratio of an In—N bond in the first oxide semiconductor layer 131 may be higher than a ratio of an In—N bond in the second oxide semiconductor layer 132. Here, the ratio of the In—N bond in the first oxide semiconductor layer 131 may denote a ratio of elements bonded to nitrogen among indium elements included in the first oxide semiconductor layer 131, and the ratio of the In—N bond in the second oxide semiconductor layer 132 may denote a ratio of elements bonded to nitrogen among indium elements included in the second oxide semiconductor layer 132.

In more detail, when an In—N bond increases, an In—H bond may be relatively reduced. Hydrogen bonded to metal or oxygen in metal oxide may break a bond and may be activated even under a condition where a temperature is low or an energy absorption rate is low. Therefore, an operation predictability of the TFT 100 may be reduced due to hydrogen included in the oxide semiconductor layer 130, causing a reduction in reliability of the TFT 100. For example, due to hydrogen, the positive bias temperature stress (PBTS) measurement degradation of the TFT 100 may be accelerated, and a threshold voltage (Vth) of the TFT 100 may be shifted to a negative (−) voltage. However, when an In—N bond in the oxide semiconductor layer 130 increases, an In—H bond may be relatively reduced, and the unstable driving of the TFT 100 may be repaired, thereby enhancing reliability.

According to an embodiment of the present disclosure, since the ratio of the In—N bond in the first oxide semiconductor layer 131 is higher than the ratio of the In—N bond in the second oxide semiconductor layer 132, the first oxide semiconductor layer 131 may be better in film stability than the second oxide semiconductor layer 132 and may stably support the second oxide semiconductor layer 132.

Moreover, the second oxide semiconductor layer 132 may include hydrogen. Hydrogen included in the second oxide semiconductor layer 132 may be bonded to indium to form an In—H bond. When hydrogen is bonded to indium, a carrier concentration of the second oxide semiconductor layer 132 may increase. Accordingly, a current characteristic of the second oxide semiconductor layer 132 may be enhanced.

As a concentration of nitrogen in the oxide semiconductor layer 130 decreases, a probability that indium is bonded to nitrogen may be lowered, and a probability that indium is bonded to hydrogen may increase. In the second oxide semiconductor layer 132, a concentration of nitrogen may be reduced in a direction closer to the gate electrode 140, and thus, a ratio of an In—H bond may increase. The ratio of the In—H bond in the second oxide semiconductor layer 132 may denote a ratio of elements bonded to hydrogen among indium elements included in the second oxide semiconductor layer 132.

A gate insulation layer 120 may be disposed on the oxide semiconductor layer 130. The gate insulation layer 120 may include at least one of silicon oxide and silicon nitride and may also include oxide aluminum ($Al_2O_3$). The gate insulation layer 120 may have a single-layer structure, or may have a multilayer structure. Referring to FIG. 1, the gate insulation layer 120 may contact the second oxide semiconductor layer 132.

The gate electrode 140 may be disposed on the gate insulation layer 120. In detail, the gate electrode 140 may be insulated from the oxide semiconductor layer 130 and may overlap at least a portion of the oxide semiconductor layer 130. As illustrated in FIG. 1, in the TFT 100, a structure where the gate electrode 140 is disposed on the oxide semiconductor layer 130 may be referred to as a top gate structure.

The gate electrode 140 may include at least one of aluminum-based metal such as aluminum (Al) or an Al alloy, silver-based metal such as silver (Ag) or an Ag alloy, copper-based metal such as copper (Cu) or a Cu alloy, molybdenum-based metal such as molybdenum (Mo) or an Mo alloy, chromium (Cr), tantalum (Ta), neodymium (Nd), and titanium (Ti). The gate electrode 140 may have a multilayer structure including at least two conductive layers having different physical properties.

An interlayer insulation layer 170 may be disposed on the gate electrode 140. The interlayer insulation layer 170 may include an insulating material. In detail, the interlayer insulation layer 170 may include an organic material or an inorganic material, or may be provided in a stacked structure of an organic material layer and an inorganic material layer.

The source electrode 150 and the drain electrode 160 may be disposed on the interlayer insulation layer 170. The source electrode 150 and the drain electrode 160 may be spaced apart from each other and may be connected to the oxide semiconductor layer 130. Referring to FIG. 1, each of the source electrode 150 and the drain electrode 160 may be connected to the oxide semiconductor layer 130 through a corresponding contact hole of contact holes provided in the interlayer insulation layer 170. In more detail, the source electrode 150 and the drain electrode 160 may be connected to the second oxide semiconductor layer 132.

The source electrode 150 and the drain electrode 160 may include at least one of Mo, Al, Cr, gold (Au), titanium (Ti), nickel (Ni), Nd, Cu, and an alloy thereof. Each of the source electrode 150 and the drain electrode 160 may be provided as a single layer including metal or a metal alloy, or may be provided as a multilayer including two or more layers.

Figure 2:
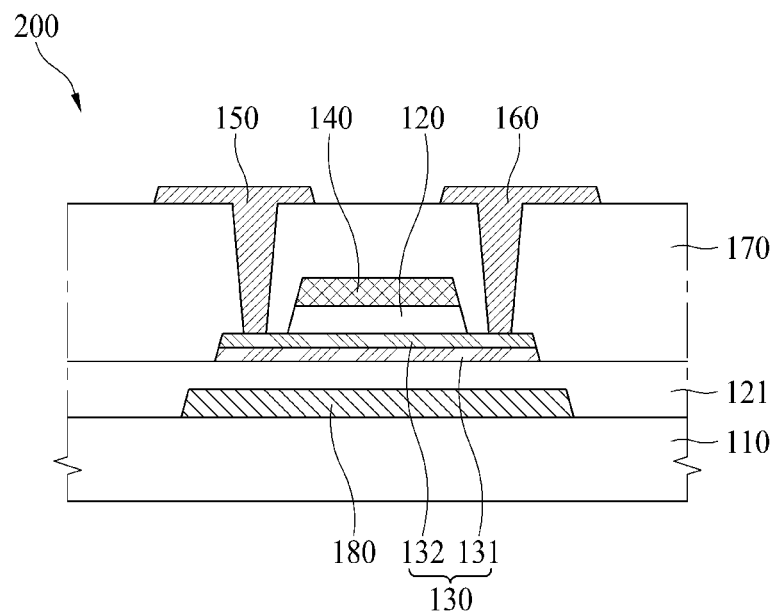
FIG. 2 is a cross-sectional view of a TFT according to another embodiment of the present disclosure.

FIG. 2 is a cross-sectional view of a TFT 200 according to another embodiment of the present disclosure. Hereinafter, descriptions of the above-described elements are omitted for avoiding repetitive descriptions.

In comparison with the TFT 100 of FIG. 1, the TFT 200 of FIG. 2 may further include a light blocking layer 180 on a substrate 110 and a buffer layer 121 on the light blocking layer 180.

The light blocking layer 180 may overlap an oxide semiconductor layer 130. The light blocking layer 180 may block light incident on the oxide semiconductor layer 130 of the TFT 200 from the outside to prevent the oxide semiconductor layer 130 from being damaged by external incident light.

Generally, the light blocking layer 180 may include an electrically conductive material such as metal, and thus, the buffer layer 121 may be disposed on the light blocking layer 180 so as to insulate the light blocking layer 180 from the oxide semiconductor layer 130.

Hereinafter, a method of manufacturing the TFT 200 will be described with reference to FIGS. 3A to 3H. FIGS. 3A to 3H are process views of a method of manufacturing the TFT 200 according to an embodiment of the present disclosure.

Figure 3A:
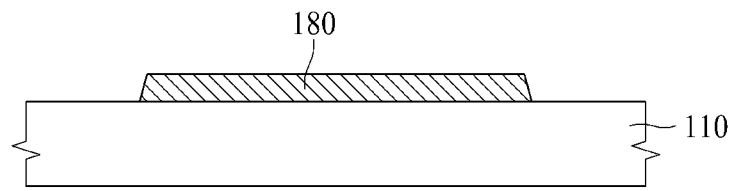
FIGS. 3A to 3H are process views of a method of manufacturing a TFT according to an embodiment of the present disclosure.

Referring to FIG. 3A, the light blocking layer 180 may be formed on the substrate 110.

Glass may be used as the substrate 110, or transparent plastic capable of being bent or deflected may be used as the substrate 110. Examples of plastic used as the substrate 110 may include polyimide. In a case where polyimide is used as the substrate 110, since a high temperature deposition process is performed on the substrate 110, heat-resistant polyimide capable of enduring a high temperature may be used.

In a case where a plastic substrate is used as the substrate 110 for forming the TFT 200, a deposition process, an etching process, and the like may be performed in a state where the plastic substrate is disposed on a carrier substrate including a high-durability material such as glass.

The light blocking layer 180 may prevent the oxide semiconductor layer 130 from being damaged by light incident from the outside. The light blocking layer 180 may include a material which reflects or absorbs light, and for example, may include an electrically conductive material such as metal.

Figure 3B:
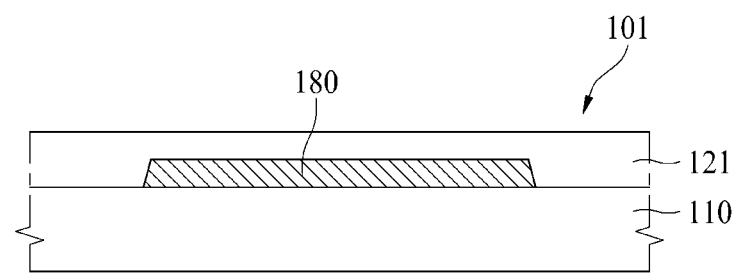

Referring to FIG. 3B, the buffer layer 121 may be formed on the substrate 110 including the light blocking layer 180. Therefore, a first deposition target substrate 101 may be manufactured.

Figure 3C:
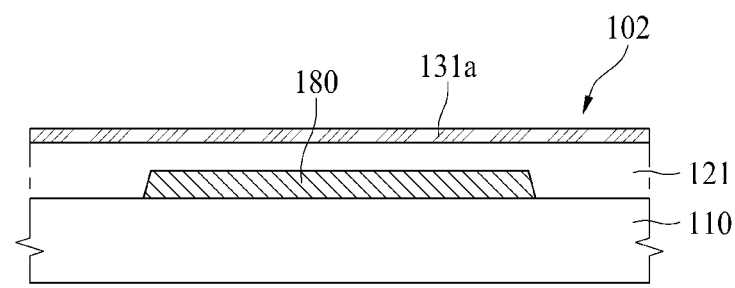
Figure 3D:
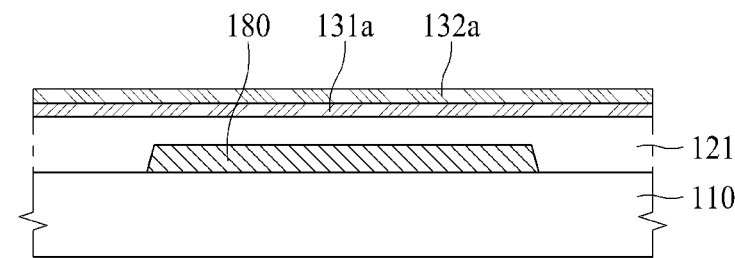
Figure 3E:
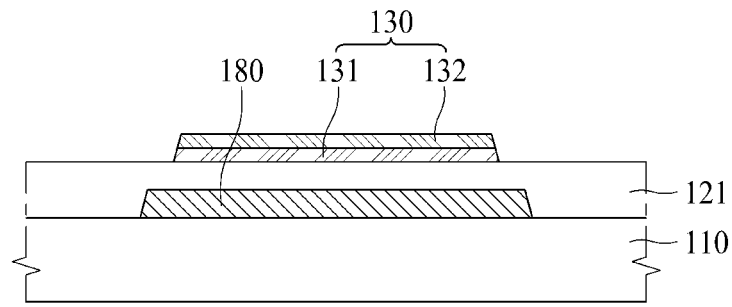

Subsequently, the oxide semiconductor layer 130 may be formed on the substrate 110. Referring to FIGS. 3C to 3E, the oxide semiconductor layer 130 may be formed on the buffer layer 121 on the substrate 110 and may one-dimensionally overlap the light blocking layer 180.

Hereinafter, a process of forming the oxide semiconductor layer 130 will be described in more detail with reference to FIGS. 3C, 3D, 3E, 4A, and 4B.

Figure 4A:
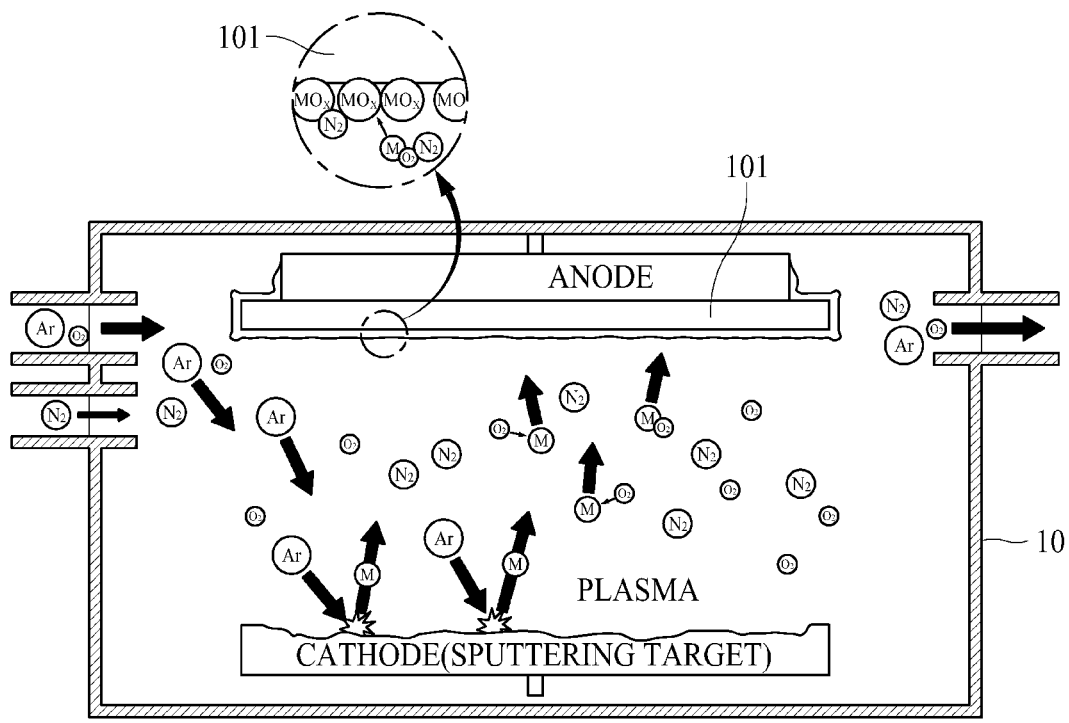
FIGS. 4A and 4B are schematic views for describing a sputtering deposition process.

First, referring to FIGS. 3C and 4A, a first oxide semiconductor material layer 131a may be formed on the substrate 110 through a sputtering deposition process under a condition where an oxygen gas ($O_2$) and a nitrogen gas ($N_2$) are provided in a chamber 10. In more detail, the first oxide semiconductor material layer 131a may be formed on the buffer layer 121 on the substrate 110.

The first oxide semiconductor material layer 131a may include an oxide semiconductor material and nitrogen (N). The first oxide semiconductor material layer 131a may include nitrogen (N) and an oxide semiconductor material such as IZO (InZnO), IGO (InGaO), ITO (InSnO), IGZO (InGaZnO), IGZTO (InGaZnSnO), GZTO (GaZnSnO), GZO (GaZnO), or ITZO (InSnZnO).

FIG. 4A is a schematic view for describing a sputtering deposition process of forming the first oxide semiconductor layer 131. Referring to FIG. 4A, the first deposition target substrate 101 manufactured by forming the light blocking layer 180 and the buffer layer 121 on the substrate 110 may be loaded into the chamber 10.

A sputtering target may be disposed in a cathode of the chamber 10 illustrated in FIG. 4A. Metal for forming the oxide semiconductor layer may be used as the sputtering target. For example, the sputtering target may include at least one of indium (In), gallium (Ga), zinc (Zn), and tin (Sn). The first deposition target substrate 101 may be disposed in an anode of the chamber 10.

In a process of forming the first oxide semiconductor material layer 131a, argon (Ar), $O_2$, and $N_2$ may be supplied to the chamber 10. Plasma may be generated in the chamber 10 by using Ar, $O_2$, and $N_2$ supplied to the chamber 10, and the first oxide semiconductor material layer 131a may be formed on the first deposition target substrate 101 through a sputtering deposition process based on the plasma. As a result, a second deposition target substrate 102 may be formed.

Nitrogen may be distributed in a whole region of the first oxide semiconductor material layer 131a through a sputtering deposition process.

A flow rate of $N_2$ supplied to the chamber 10 may be 1% to 50% of a flow rate of all gases supplied to the chamber 10. When the flow rate of $N_2$ is less than 1% of the flow rate of the total gas, a content of nitrogen may be insufficient in the first oxide semiconductor material layer 131a, and due to this, the first oxide semiconductor layer 131 may not be good in film stability and nitrogen may not sufficiently be supplied from the first oxide semiconductor layer 131 to the second oxide semiconductor layer 132. On the other hand, when the flow rate of $N_2$ is more than 50% of the flow rate of the total gas, the film stability of the first oxide semiconductor material layer 131a may be reduced due to excessive nitrogen.

In a process of forming the first oxide semiconductor material layer 131a, as the flow rate of $N_2$ is adjusted to 1% to 50% of the flow rate of the total gas, the first oxide semiconductor layer 131 formed based on the first oxide semiconductor material layer 131a may include nitrogen of 1 at % to 5 at % concentration with respect to the number of atoms.

Moreover, the first oxide semiconductor material layer 131a may be formed to have a thickness of 3 nm to 50 nm. As a result, the first oxide semiconductor layer 131 may be formed to have a thickness of 3 nm to 50 nm.

Figure 4B:
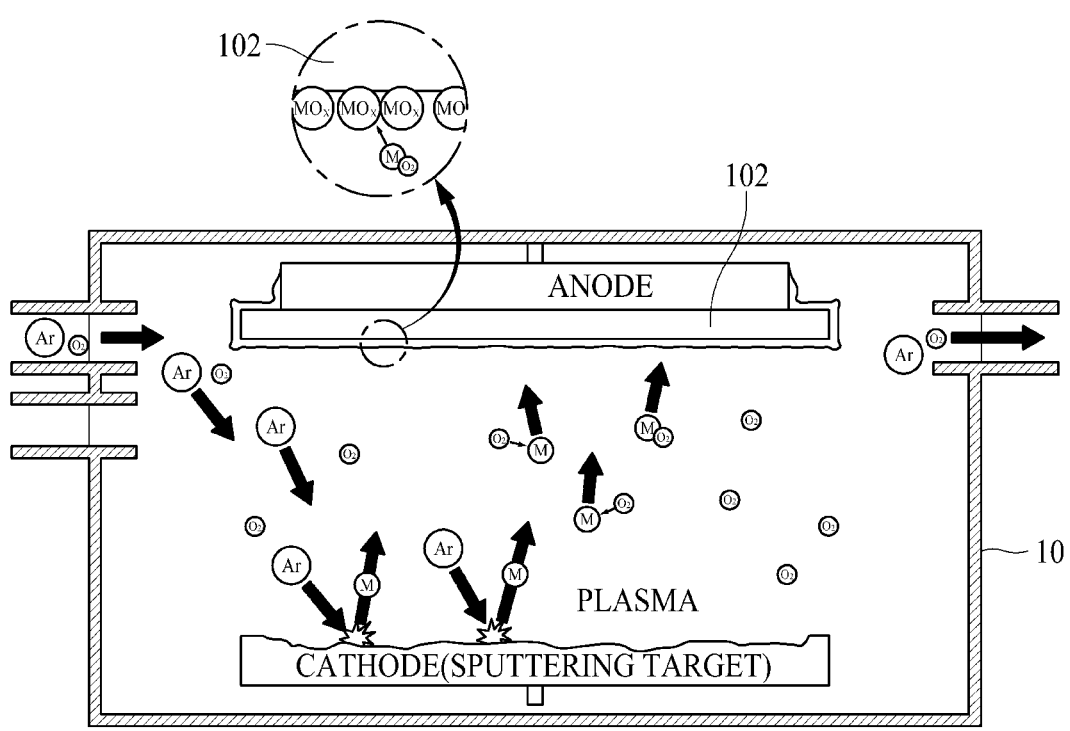

Referring to FIGS. 3D and 4B, a second oxide semiconductor material layer 132a may be formed on the first oxide semiconductor material layer 131a through a sputtering deposition process under a condition where an oxygen gas ($O_2$) is provided in a chamber 10.

The second oxide semiconductor material layer 132a may include, for example, at least one of oxide semiconductor materials such as IZO (InZnO), IGO (InGaO), ITO (InSnO), IGZO (InGaZnO), IGZTO (InGaZnSnO), GZTO (GaZn-SnO), GZO (GaZnO), or ITZO (InSnZnO). For example, the second oxide semiconductor material layer 132a may be formed of the same oxide semiconductor material as that of the first oxide semiconductor material layer 131a.

FIG. 4B is a schematic view for describing a sputtering deposition process of forming the second oxide semiconductor layer 132.

Referring to FIG. 4B, the second oxide semiconductor material layer 132a may be formed on the first oxide semiconductor material layer 131a through the sputtering deposition process under a condition where an oxygen gas ($O_2$) is provided in a chamber 10. A process of forming the first oxide semiconductor material layer 131a and a process of forming the second oxide semiconductor material layer 132a may be performed as a continuous process in the same chamber 10.

In FIG. 4B, the sputtering target may be disposed in the cathode of the chamber 10. Metal for forming the oxide semiconductor layer may be used as the sputtering target. For example, the sputtering target may include at least one of In, Ga, Zn, and Sn. The second deposition target substrate 102 may be disposed in the anode of the chamber 10.

In order to perform a sputtering deposition process, a sputtering gas may be injected into the chamber 10. Ar and $O_2$ may each be used as the sputtering gas for forming the second oxide semiconductor material layer 132a. Plasma may be generated in the chamber 10, and the second oxide semiconductor material layer 132a may be formed on the first oxide semiconductor material layer 131a through a sputtering deposition process based on the plasma.

The second oxide semiconductor material layer 132a may be formed to have a thickness of 5 nm to 30 nm. Therefore, the second oxide semiconductor layer 132 may be formed to have a thickness of 5 nm to 30 nm.

Referring to FIG. 3E, the first oxide semiconductor material layer 131a and the second oxide semiconductor material layer 132a may be patterned, and thus, the first oxide semiconductor layer 131 and the second oxide semiconductor layer 132 may be formed. Therefore, the oxide semiconductor layer 130 including the first oxide semiconductor layer 131 and the second oxide semiconductor layer 132 may be formed.

Figure 3F:
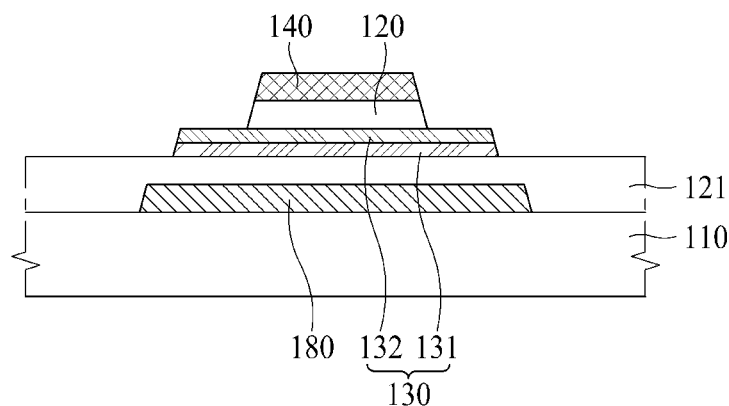

Referring to FIG. 3F, the gate insulation layer 120 and the gate electrode 140 may be formed on the oxide semiconductor layer 130. The gate electrode 140 may be insulated from the oxide semiconductor layer 130 to overlap at least a portion of the oxide semiconductor layer 130. The gate insulation layer 120 may be provided between the gate electrode 140 and the oxide semiconductor layer 130 to insulate the gate electrode 140 from the oxide semiconductor layer 130. After the gate electrode 140 is formed, a region of the oxide semiconductor layer 130 exposed from the gate electrode 140 may have a conductive characteristic. Based on the conductive characteristic, a source electrode connection part and a drain electrode connection part may be formed.

Figure 3G:
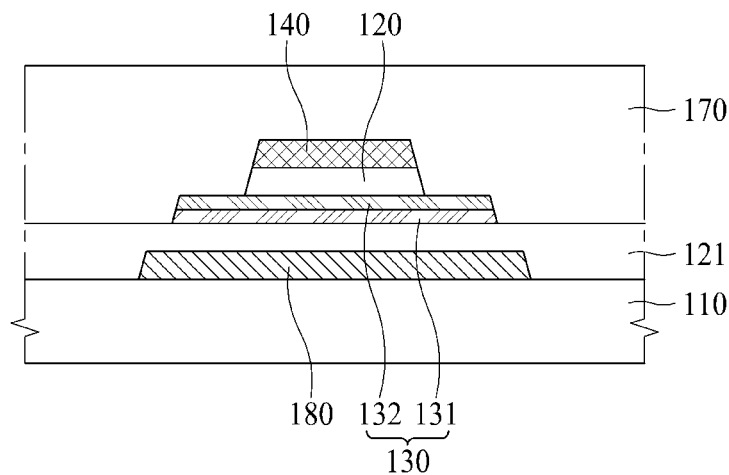

Referring to FIG. 3G, the interlayer insulation layer 170 may be formed on the gate electrode 140. The interlayer insulation layer 170 may include an organic material or an inorganic material, or may be provided in a stacked structure of an organic material layer and an inorganic material layer.

Figure 3H:
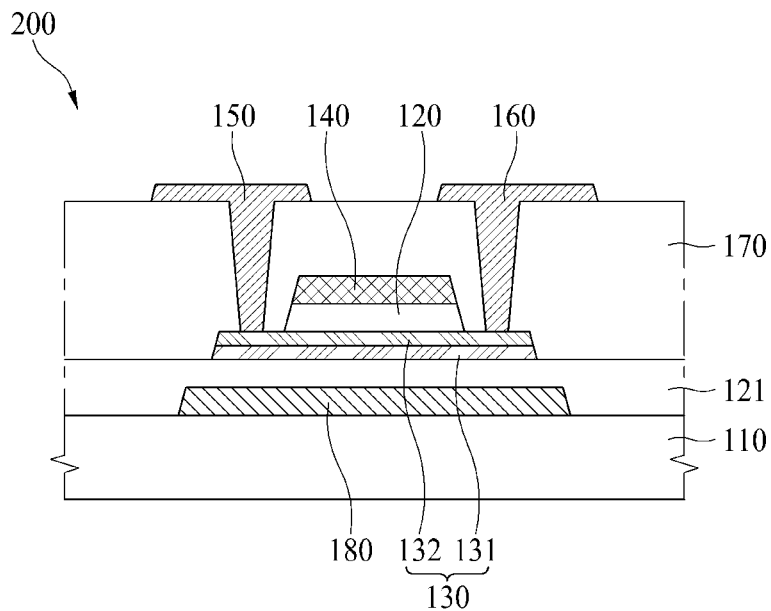

Referring to FIG. 3H, the source electrode 150 and the drain electrode 160 may be formed on the interlayer insulation layer 170. The source electrode 150 and the drain electrode 160 may be spaced apart from each other and may be connected to the oxide semiconductor layer 130. As a result, the TFT 200 illustrated in FIG. 3H may be manufactured.

Figure 5:
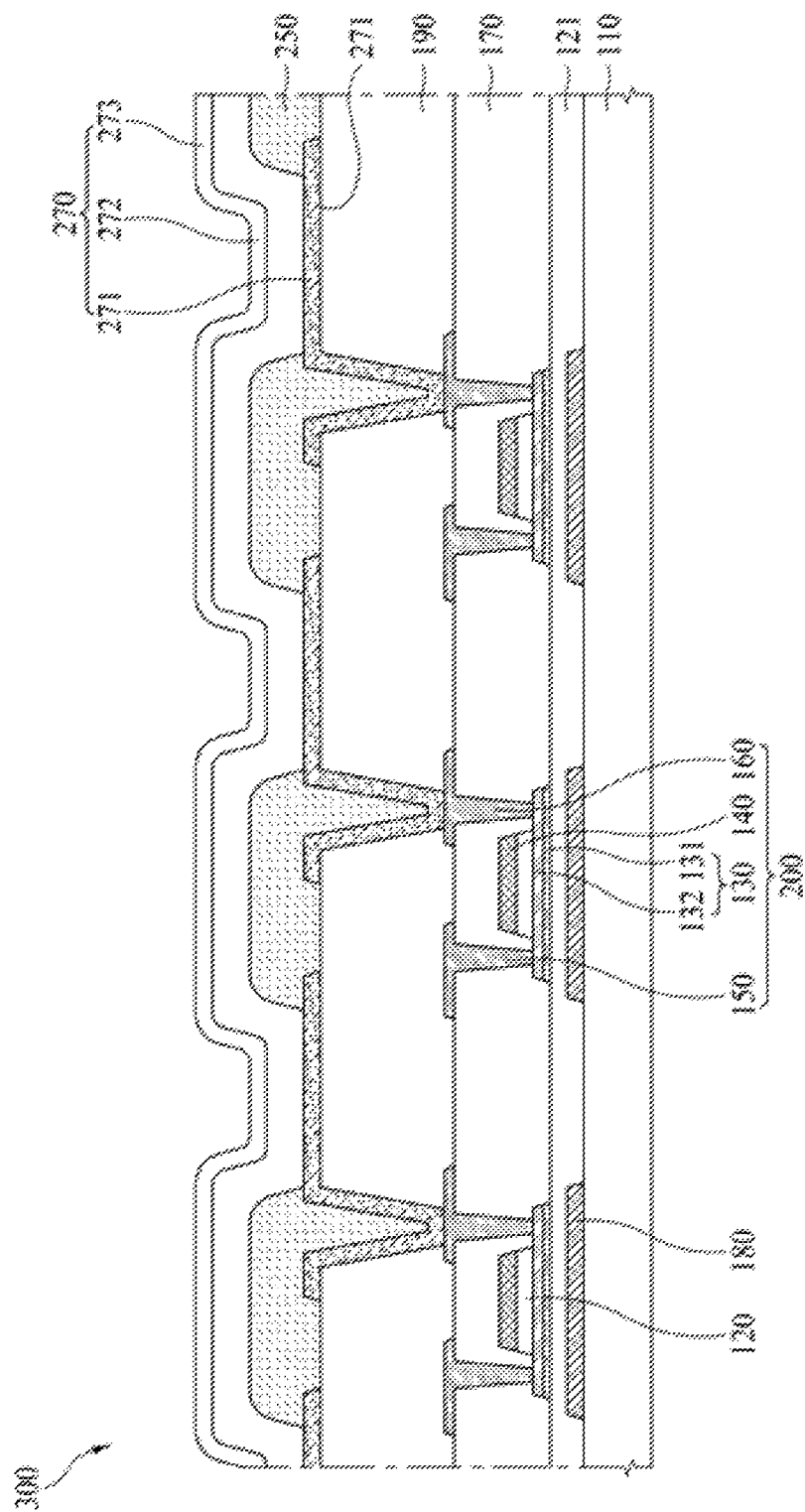
FIG. 5 is a schematic cross-sectional view of a display apparatus according to an embodiment of the present disclosure.

FIG. 5 is a schematic cross-sectional view of a display apparatus 300 according to an embodiment of the present disclosure.

In FIG. 5, the display apparatus 300 including the TFT 200 of FIG. 2 is illustrated. However, another embodiment of the present disclosure is not limited thereto, and the TFT 100 of FIG. 1 may be applied to the display apparatus 300 of FIG. 5.

Referring to FIG. 5, the display apparatus 300 may include a substrate 110, a TFT 200 disposed on the substrate 110, and a first electrode 271 connected to the TFT 200. Also, the display apparatus 300 may include an organic layer 272 disposed on the first electrode 271 and a second electrode 273 disposed on the organic layer 272.

In detail, the substrate 110 may include glass, plastic, and/or the like. A light blocking layer 180 may be disposed on the substrate 110, and a buffer layer 121 may be disposed on the light blocking layer 180.

The TFT 200 may be disposed on the buffer layer 121 on the substrate 110. The TFT 200 may include an oxide semiconductor layer 130 on the substrate 110, a gate electrode 140 which is insulated from the oxide semiconductor layer 130 and overlaps at least a portion of the oxide semiconductor layer 130, a source electrode 150 connected to the oxide semiconductor layer 130, and a drain electrode 160 which is spaced apart from the source electrode 150 and is connected to the oxide semiconductor layer 130. The oxide semiconductor layer 130 may include a first oxide semiconductor layer 131 and a second oxide semiconductor layer 132 on the first oxide semiconductor layer 131. The first oxide semiconductor layer 131 may include nitrogen of 1 at % to 5 at % concentration with respect to the number of atoms. The second oxide semiconductor layer 132 may have a nitrogen concentration which is lower than that of the first oxide semiconductor layer 131 and may have a gradient of a nitrogen concentration such that the nitrogen concentration is lowered in a direction closer to the gate electrode 140.

A planarization layer 190 may be disposed on the TFT 200 and may planarize an upper portion of the substrate 110. The planarization layer 190 may include an organic insulating material such as acrylic resin having photosensitivity, but is not limited thereto.

The first electrode 271 may be disposed on the planarization layer 190. The first electrode 271 may be connected to a drain electrode 160 of the TFT 200 through a contact hole included in the planarization layer 190.

A bank layer 250 may be disposed on the first electrode 271 and the planarization layer 190 to define a pixel area or an emission area. For example, the bank layer 250 may be disposed in a matrix structure in a boundary area between a plurality of pixels, and thus, the pixel area may be defined by the bank layer 250.

The organic layer 272 may be disposed on the first electrode 271. The organic layer 272 may also be disposed on the bank layer 250. That is, the organic layer 272 may be connected to an adjacent organic layer between adjacent pixels without being separated from each other by units of pixels.

The organic layer 272 may include an organic light emitting layer. The organic layer 272 may include one organic light emitting layer, or may include two or more organic light emitting layers which are vertically stacked.

The organic layer 272 may emit light having one color of red, green, and blue, or may emit white light.

The second electrode 273 may be disposed on the organic layer 272.

The first electrode 271, the organic layer 272, and the second electrode 273 may be stacked to configure an organic light emitting device 270. The organic light emitting device 270 may act as a light amount control layer in the display apparatus 300.

Although not shown, in a case where the organic layer 272 emits white light, an individual pixel may include a color filter for filtering, by units of wavelengths, the white light emitted from the organic layer 272. The color filter may be provided on a movement path of light. In a bottom emission type where light emitted from the organic layer 272 travels in a direction toward the substrate 110 thereunder, the color filter may be disposed under the organic layer 272. In a top emission type where light emitted from the organic layer 272 travels in a direction toward the second electrode 273 thereon, the color filter may be disposed on the organic layer 272

Figure 6:
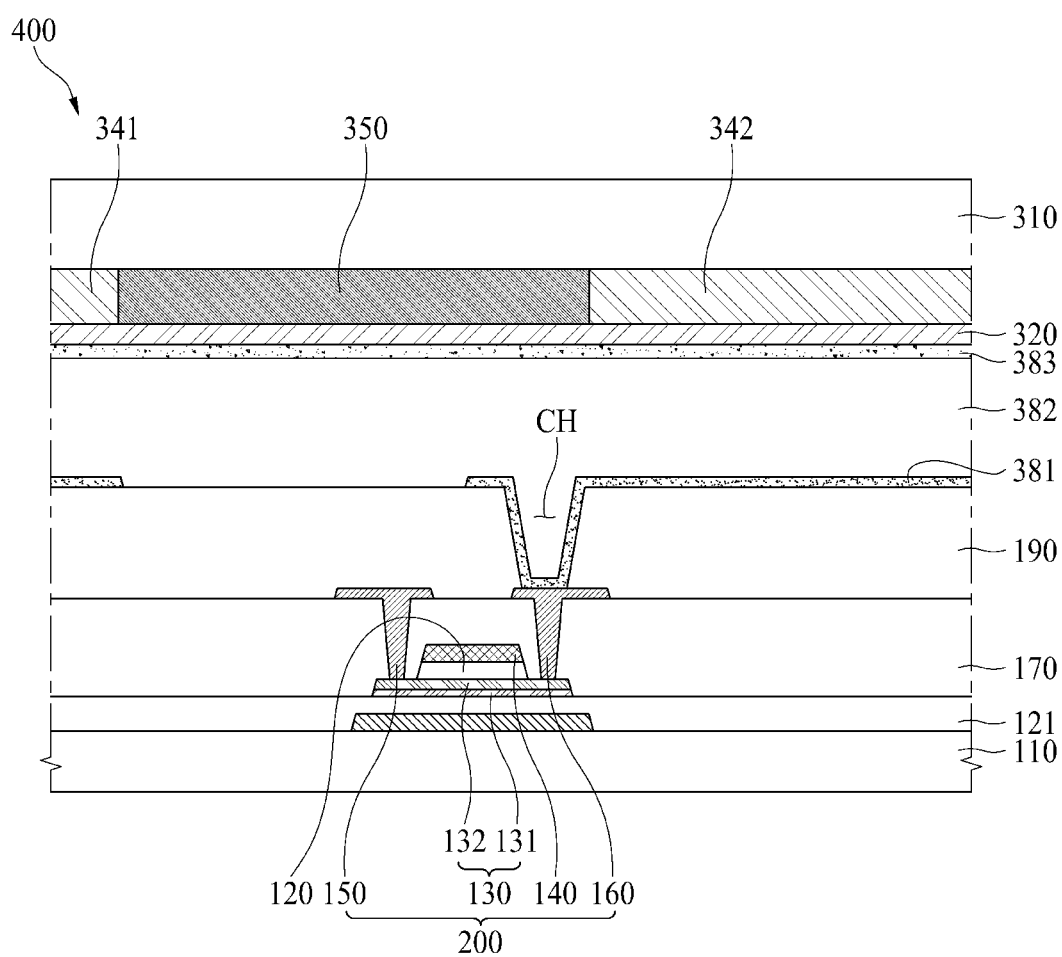
FIG. 6 is a schematic cross-sectional view of a display apparatus according to another embodiment of the present disclosure.

FIG. 6 is a schematic cross-sectional view of a display apparatus 400 according to another embodiment of the present disclosure.

Referring to FIG. 6, the display apparatus 400 according to another embodiment of the present disclosure may include a substrate 110, a TFT 200 disposed on the substrate 110, and a first electrode 381 connected to the TFT 200. Also, the display apparatus 400 may include a liquid crystal layer 382 disposed on the first electrode 381 and a second electrode 383 disposed on the liquid crystal layer 382.

The liquid crystal layer 382 may act as a light amount control layer. The display apparatus 400 of FIG. 6 may be a liquid crystal display (LCD) apparatus including the liquid crystal layer 382.

In detail, the display apparatus 400 of FIG. 6 may include the substrate 110, the TFT 200, a planarization layer 190, the first electrode 381, the liquid crystal layer 382, a second electrode 383, a barrier layer 320, a plurality of color filters 341 and 342, a light blocking part 350, and an opposite substrate 310.

The substrate 110 may include glass, plastic, and/or the like. A light blocking layer 180 may be disposed on the substrate 110, and a buffer layer 121 may be disposed on the light blocking layer 180.

The TFT 200 may be disposed on the buffer layer 121 on the substrate 110. The TFT 200 has been described above, and thus, its detailed description is omitted.

The planarization layer 190 may be disposed on the TFT 200 to planarize an upper portion of the substrate 110.

The first electrode 381 may be disposed on the planarization layer 190. The first electrode 381 may be connected to a drain electrode 160 of the TFT 200 through a contact hole CH included in the planarization layer 190.

The opposite substrate 310 may be disposed to be opposite to the substrate 110.

The light blocking layer 350 may be disposed on the opposite substrate 310. The light blocking part 350 may include a plurality of openings. The plurality of openings may be disposed in correspondence with the first electrode 381 which is a pixel electrode. The light blocking part 350 may block light in a portion except the openings. The light blocking part 350 may be omitted.

The color filters 341 and 342 may be disposed on the opposite substrate 310 and may selectively block light incident from a backlight unit (not shown). In detail, the color filters 341 and 342 may be disposed in a plurality of openings defined by the light blocking part 350. Each of the color filters 341 and 342 may realize one of red, green, and blue. Each of the color filters 341 and 342 may realize a color other than red, green, and blue.

The barrier layer 320 may be disposed on the color filters 341 and 342 and the light blocking part 350. The barrier layer 320 may be omitted.

The second electrode 383 may be disposed on the barrier layer 320. For example, the second electrode 383 may be disposed in front of the opposite substrate 310. The second electrode 383 may include a transparent conductive material such as indium tin oxide (ITO) or indium zinc oxide (IZO).

The first electrode 381 and the second electrode 383 may be disposed to be opposite to each other, and the liquid crystal layer 382 may be disposed therebetween. The second electrode 383 may apply an electric field to the liquid crystal layer 382 along with the first electrode 381.

Surfaces facing each other between the substrate 110 and the opposite substrate 310 may each be defined as an upper surface of a corresponding substrate, and surfaces disposed on the side opposing the upper surfaces may each be defined as a lower surface of a corresponding substrate. In this case, a polarizer may be disposed on a lower surface of the substrate 110, and another polarizer may be disposed on a lower surface of the opposite substrate 310.

Hereinafter, the present disclosure will be in more detail with reference to an embodiment, a comparative example, and a test example.

Embodiment 1

The first oxide semiconductor material layer 131a is formed on the substrate 110 including glass to have a thickness of 10 nm through a sputtering deposition process, and the second oxide semiconductor material layer 132a is formed thereon to have a thickness of 20 nm through a sputtering deposition process. Subsequently, the first oxide semiconductor layer 131 and the second oxide semiconductor layer 132 are formed by respectively patterning the first oxide semiconductor material layer 131a and the second oxide semiconductor material layer 132a, thereby manufacturing the oxide semiconductor layer 130 including the first oxide semiconductor layer 131 and the second oxide semiconductor layer 132. The first oxide semiconductor layer 131 is formed to include an IZO-based oxide semiconductor material and nitrogen at a ratio "9:1" of In to Zn with respect to the number of atoms. The second oxide semiconductor layer 132 is formed of an IZO-based oxide semiconductor material at a ratio "9:1" of In to Zn with respect to the number of atoms. An argon gas, an oxygen gas, and a nitrogen gas are used for forming the first oxide semiconductor layer 131 through a sputtering process, and a flow rate of each of the gases is adjusted to 50 sccm. Also, an argon gas and an oxygen gas are used for forming the second oxide semiconductor layer 132 through a sputtering process, and a flow rate of each of the gases is adjusted to 50 sccm.

Subsequently, the gate insulation layer 120 including silicon nitride and the gate electrode 140 including an Mo/Ti alloy and having a thickness of 100 nm are formed on the oxide semiconductor layer 130, and the interlayer insulation layer 170 including silicon oxide is formed thereon. Subsequently, each of the source electrode 150 and the drain electrode 160 is formed to have a thickness of 100 nm by using an Mo/Ti alloy, thereby manufacturing a TFT of the embodiment 1. In a process of manufacturing the TFT of the embodiment 1, nine TFTs are manufactured on one glass substrate 110.

Comparative Example 1

Except for that only the second oxide semiconductor layer 132 of the oxide semiconductor layer 130 is provided to have a thickness of 10 nm without providing the first oxide semiconductor layer 131 of the oxide semiconductor layer 130, a TFT of the comparative example 1 is manufactured identical to the TFT of the embodiment 1. In this case, nine TFTs have been manufactured on one glass substrate 110, but the oxide semiconductor layer 130 have been swept away in four TFTs and only five TFTs have been manufactured as finished products.

Comparative Example 2

Except for that a thickness of the second oxide semiconductor layer 132 is 20 nm, a TFT of the comparative example 2 is manufactured identical to the TFT of the comparative example 1. In the comparative example 2, nine TFTs have been manufactured on one glass substrate 110.

[Test Example 1] Nitrogen Concentration Measurement

In the TFT of the embodiment 1, a relative nitrogen concentration has been measured with respect to a depth of the oxide semiconductor layer 130.

In this case, time of flight secondary ion mass spectrometry (TOF-SIMS) has been used. The TOF-SIMS is an apparatus which applies a primary ion having certain energy to a solid surface and analyzes a secondary ion emitted from the solid surface to analyze atoms or molecules included in a material surface.

In detail, in one TFT manufactured according to the embodiment 1, a surface of the oxide semiconductor layer 130 has been etched while applying certain energy to the surface, and at this time, by analyzing ions emitted from the surface, a relative nitrogen concentration has been measured with respect to a depth from the surface of the oxide semiconductor layer 130. A result of the test example 1 is shown in FIG. 7.

Figure 7:
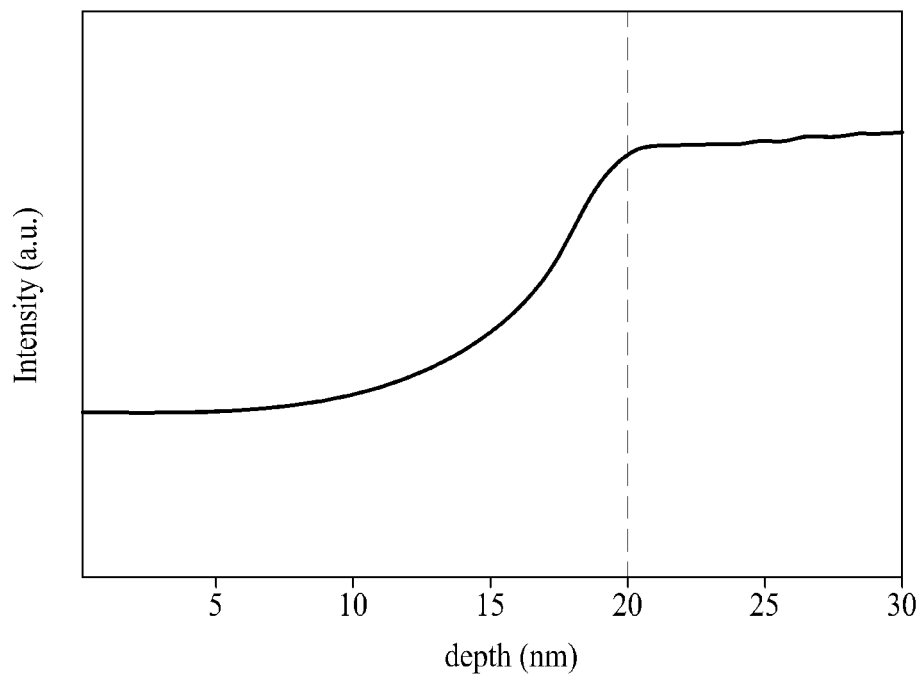
FIG. 7 is a graph showing a relative content of nitrogen with respect to a depth of an oxide semiconductor layer.

FIG. 7 is a graph showing a relative content of nitrogen with respect to a depth of an oxide semiconductor layer. In the graph of FIG. 7, the abscissa axis represents a depth from the surface of the oxide semiconductor layer 130. In the graph of FIG. 7, a range of 0 nm to 20 nm corresponds to the second oxide semiconductor layer 132, and a range of 20 nm to 30 nm corresponds to the first oxide semiconductor layer 131. The ordinate axis represents a relative nitrogen concentration and corresponds to the number of nitrogen atoms defected in a measurement process performed by the TOF-SIMS.

Referring to FIG. 7, it may be checked that a relatively constant nitrogen concentration is maintained in the first oxide semiconductor layer 131 (a depth range of 20 nm to 30 nm), a nitrogen concentration in a direction toward a surface (a depth of 0 nm) is rapidly lowered in a boundary surface (a depth of about 20 nm) between the first oxide semiconductor layer 131 and the second oxide semiconductor layer 132, and a nitrogen concentration in a direction toward a surface (a depth of 0 nm) is progressively lowered in the second oxide semiconductor layer 132 (a depth range of 0 nm to 20 nm).

[Test Example 2] Threshold Voltage (Vth) Measurement

A threshold voltage of the TFT of the embodiment 1, a threshold voltage of the TFT of the comparative example 1, and a threshold voltage of the TFT of the comparative example 2 have been measured. In order to measure each of the threshold voltages, a drain current has been measured while applying a gate voltage of −20 V to +20 V to a corresponding TFT. A voltage of 0.1 V and a voltage of 10 V have been applied between the source electrode 150 and the drain electrode 160. Results of the measurements are shown in FIGS. 8A to 8C.

Figure 8A:
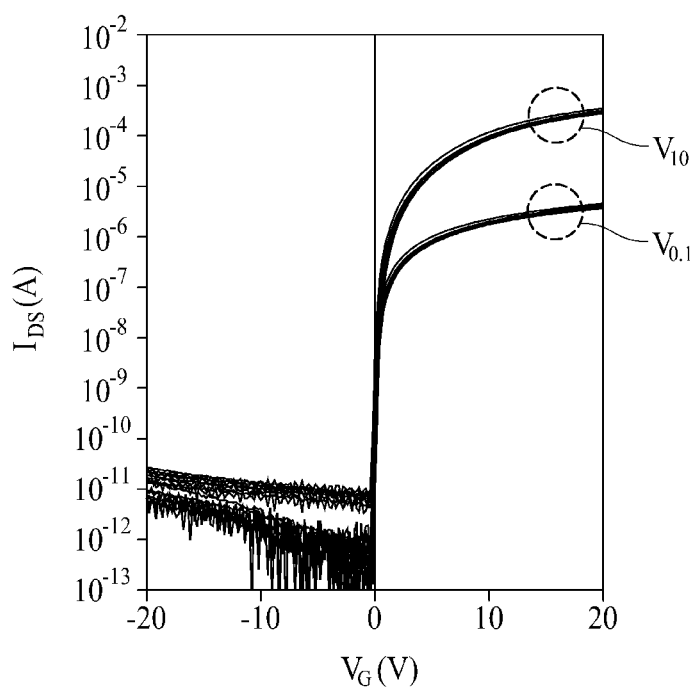
FIGS. 8A, 8B and 8C are graphs showing results obtained by measuring threshold voltages (Vth) of TFTs of a comparative example 1, a comparative example 2, and an embodiment 1.
Figure 8B:
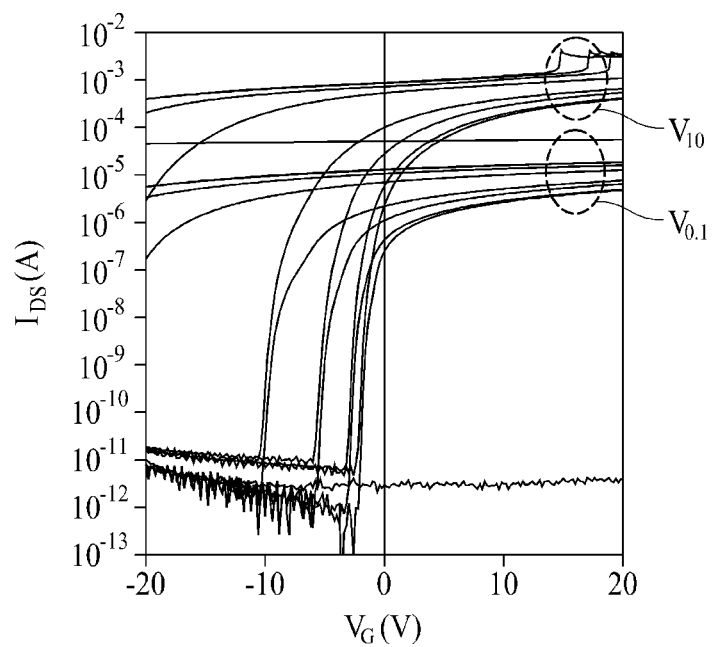
Figure 8C:
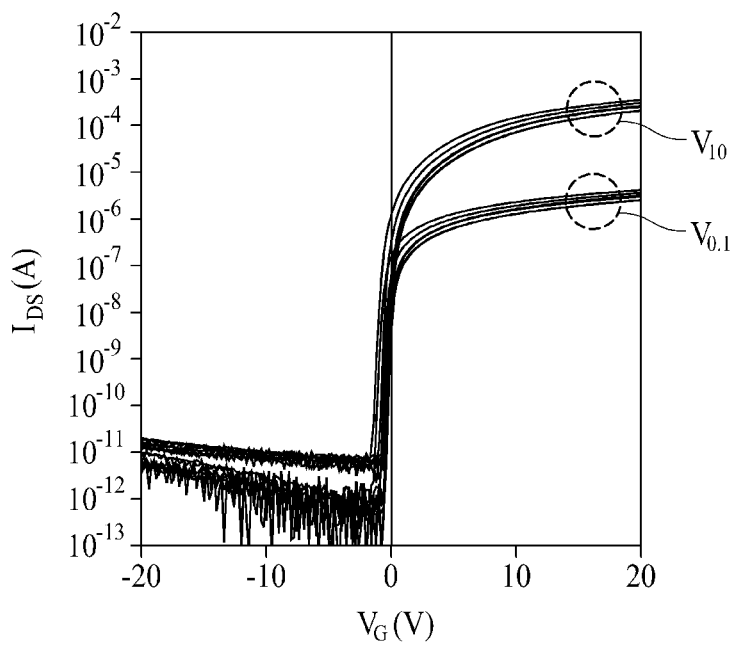

FIGS. 8A to 8C are graphs showing results obtained by measuring the threshold voltages (Vth) of the TFTs of the comparative example 1, the comparative example 2, and the embodiment 1. In FIGS. 8A to 8C, V10 represents a case where a voltage of 10 V is applied between the source electrode 150 and the drain electrode 160, and V0.1 represents a case where a voltage of 0.1 V is applied between the source electrode 150 and the drain electrode 160.

Referring to FIG. 8A, it may be seen that the TFT of the comparative example 1 shows a good threshold voltage (Vth) characteristic. In the comparative example 1, however, it has been confirmed that a defect occurs in a process of manufacturing the TFT, and due to this, unfinished products occur.

Referring to FIG. 8B, it may be seen that it is unable to measure the threshold voltage (Vth) of the TFT of the comparative example 2. Based on a result of FIG. 8B, it may be checked that the TFT cannot normally perform a function thereof in a case where the oxide semiconductor layer 130 does not include the first oxide semiconductor layer 131 which is a supporting layer and the second oxide semiconductor layer 132 includes indium without including nitrogen and has a thickness of 20 nm.

Referring to FIG. 8C, in the TFT of the embodiment 1, it may be checked that the threshold voltage (Vth) is shifted in a negative (−) direction, but a good threshold voltage (Vth) characteristic is shown.

[Test Example 3] PBTS Measurement

PBTS denotes stress under a condition where a positive (+) bias voltage is applied at a certain temperature. In order to measure the PBTS, a variation of a threshold voltage (Vth) has been measured while applying a temperature stress of 60° C. and a temperature stress of 100° C. to the TFTs of the comparative example 1 and the embodiment 1. Results of the measurements are shown in FIGS. 9A and 9B.

Figure 9A:
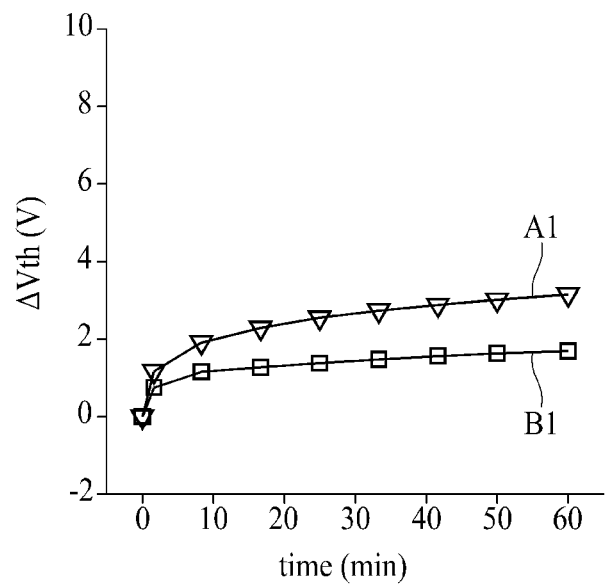
FIGS. 9A and 9B are graphs showing results obtained by measuring positive bias temperature stress (PBTS) at temperatures of 60° C. and 100° C.
Figure 9B:
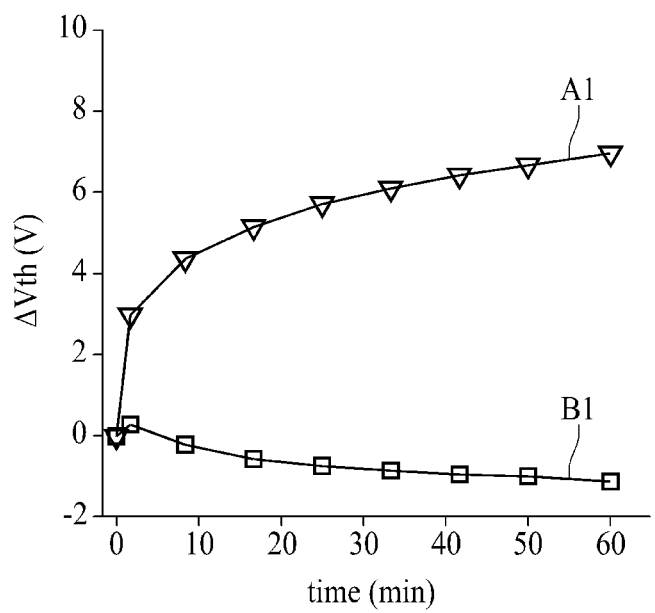
Figure 10A:
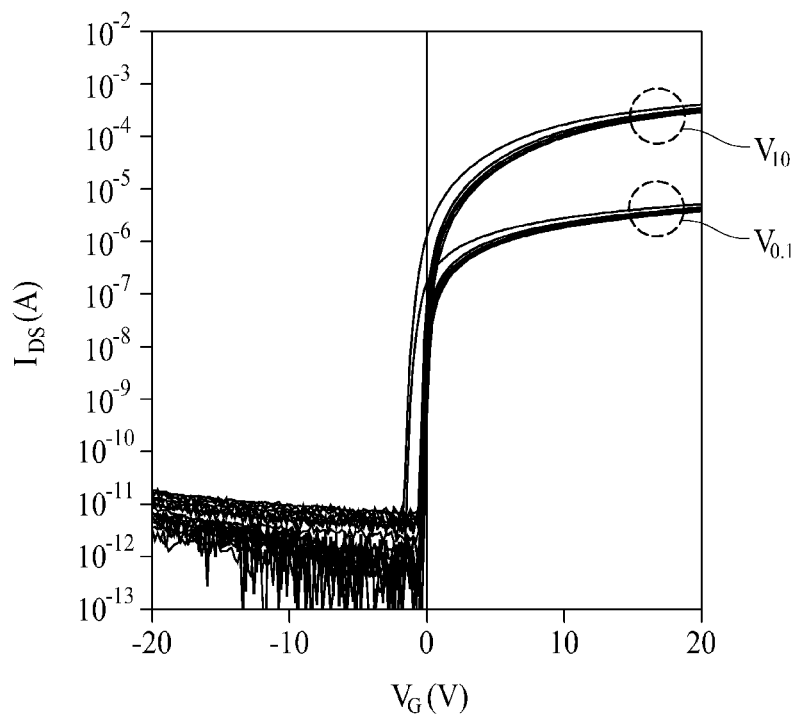
FIGS. 10A to 10F are graphs showing results obtained by measuring threshold voltages (Vth) of TFTs of embodiments 2 to 7.
Figure 10B:
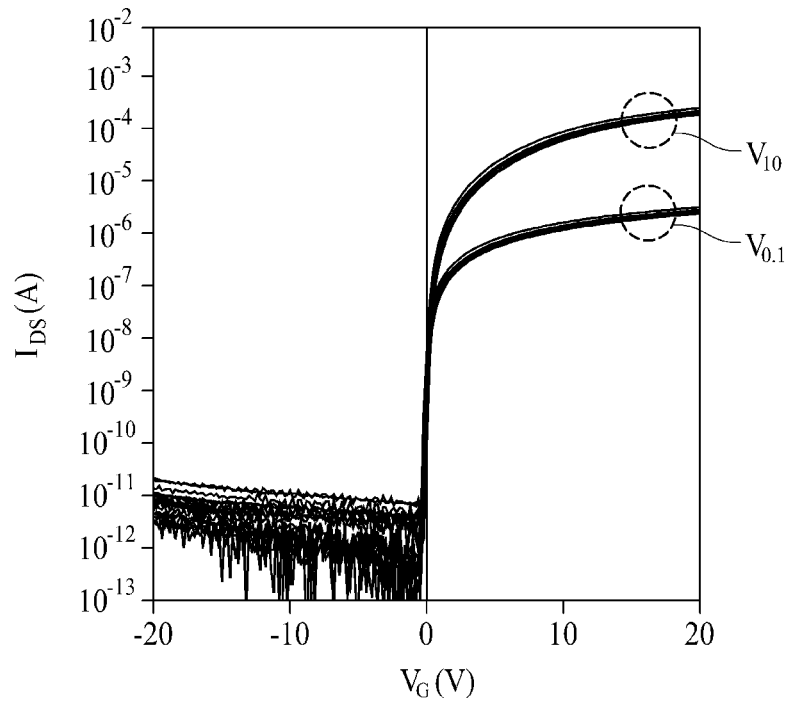
Figure 10C:
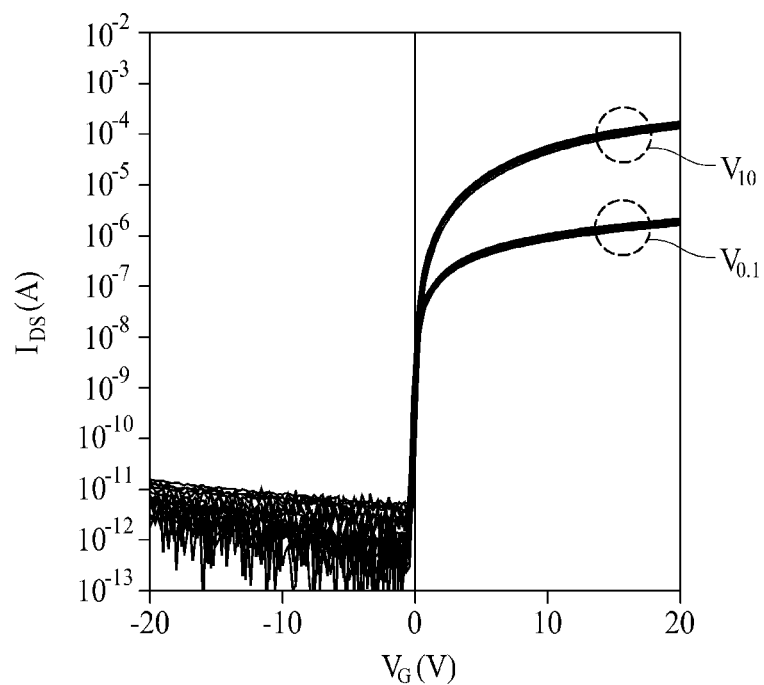
Figure 10D:
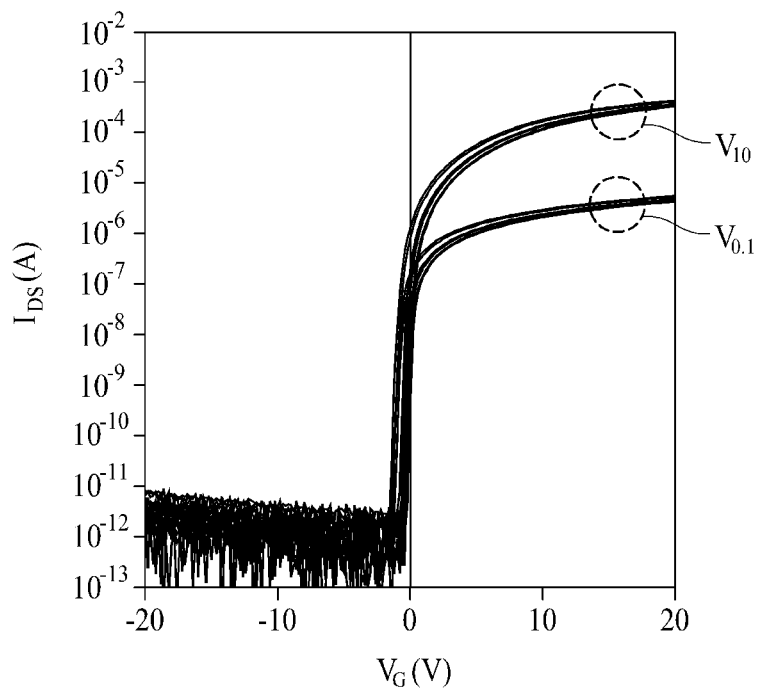
Figure 10E:
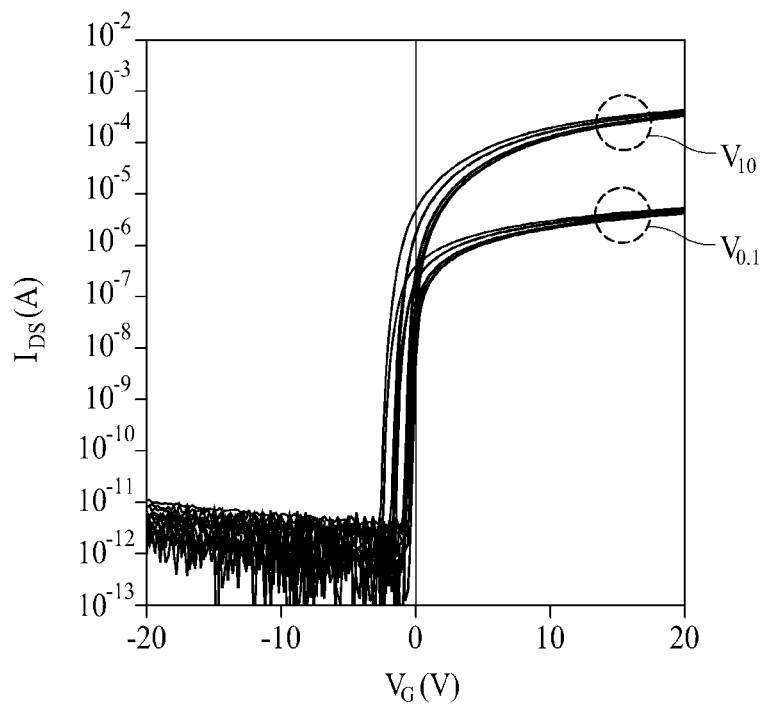
Figure 10F:
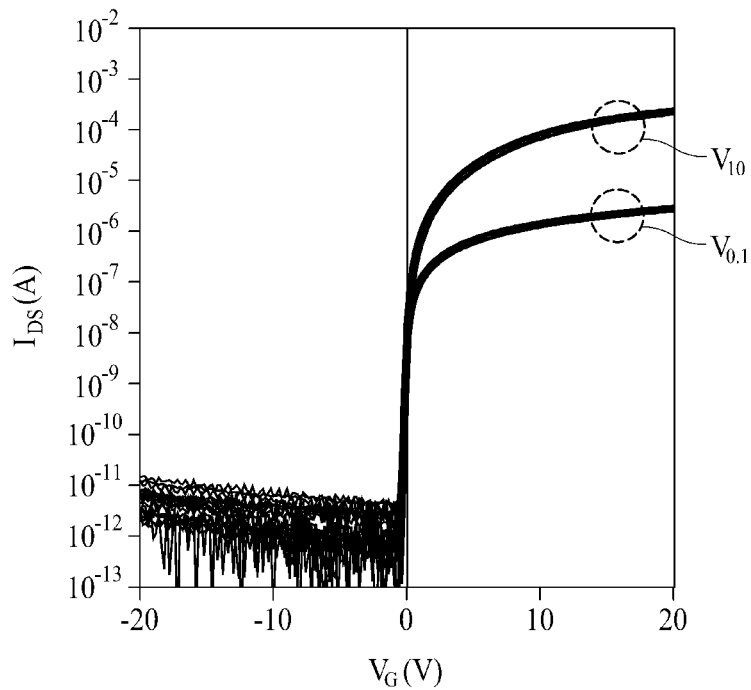

FIGS. 9A and 9B are graphs showing results obtained by measuring PBTS at temperatures of 60° C. and 100° C. In FIGS. 9A and 9B, A1 represents a result obtained by measuring the threshold voltage (Vth) of the TFT of the embodiment 1, and B1 represents a result obtained by measuring the threshold voltage (Vth) of the TFT of the comparative example 1.

Referring to FIG. 9A, it has been confirmed that, when a temperature stress of 60° C. is applied, the TFT of the embodiment 1 shows a normal PBTS characteristic and the TFT of the comparative example 1 shows a normal PBTS characteristic.

Referring to FIG. 9B, it may be checked that, when a temperature stress of 100° C. is applied, the TFT of the embodiment 1 shows a normal PBTS characteristic but the TFT of the comparative example 1 shows an abnormal PBTS characteristic where the threshold voltage (Vth) is reduced to a negative value. In this manner, it may be checked that the TFT of the comparative example 1 shows an unpredictable threshold voltage characteristic and thus is not good in reliability at a high temperature.

Embodiments 2 to 7

Although a manufacturing method of the embodiment 1 is used, TFTs of the embodiments 2 to 7 have been manufactured by forming the first oxide semiconductor layer 131 and the second oxide semiconductor layer 132 each configuring the oxide semiconductor layer 130 to have thicknesses listed in the following Table 1.

In the TFTs of the embodiments 2 to 7, results obtained by measuring threshold voltages (Vth) of the TFTs through the same method as that of the test example 2 are respectively shown in FIGS. 10A to 10F, and threshold voltage (Vth) values are listed in the following Table 1. Referring to FIGS. 10A to 10F, it may be checked that the TFTs of the embodiments 2 to 7 have a good threshold voltage (Vth) characteristic. Also, results obtained by measuring the field effect mobility of the TFTs of the embodiments 2 to 7 and the comparative example 1 are listed in the following Table 1 (mobility of Table 1).

TABLE 1

| Division | First layer thickness (nm) | Second layer thickness (nm) | Oxide semiconductor material | Mobility ($cm^2/V * s$) | Threshold voltage (V) |
|---|---|---|---|---|---|
| Embodiment 1 | 10 | 20 | In:Zn = 9:1 | 28.8 | −0.32 |
| Embodiment 2 | 3 | 10 | In:Zn = 9:1 | 33.9 | −0.03 |
| Embodiment 3 | 5 | 10 | In:Zn = 9:1 | 25.7 | 0.26 |
| Embodiment 4 | 10 | 10 | In:Zn = 9:1 | 15.1 | 0.31 |
| Embodiment 5 | 3 | 15 | In:Zn = 9:1 | 40.1 | −0.13 |
| Embodiment 6 | 5 | 15 | In:Zn = 9:1 | 38.8 | −1.33 |
| Embodiment 7 | 10 | 15 | In:Zn = 9:1 | 23.4 | 0.15 |
| Comparative example 1 | 0 | 10 | In:Zn = 9:1 | 36.3 | −0.32 |
| Comparative example 2 | 0 | 20 | In:Zn = 9:1 | Measurement impossible | Measurement impossible |

Referring to Table 1, it may be seen that the TFTs of the embodiments 1 to 7 have good mobility and thus are capable of being applied to a TFT of a display apparatus.

As described above, the TFT according to an embodiment of the present disclosure may have good reliability and operation characteristic. Also, the display apparatus including the TFT according to an embodiment of the present disclosure may have good reliability.

It will be apparent to those skilled in the art that the present invention is not limited by the embodiments and drawing, and various modifications and variations can be made in the present disclosure without departing from the spirit or scope of the disclosures. Thus, it is intended that the present disclosure covers the modifications and variations of this disclosure provided they come within the scope of the appended claims and their equivalents.

[EXPLANATION OF REFERENCE]

100, 200: TFT
110: substrate
121: buffer layer
131: first oxide semiconductor layer
140: gate electrode
160: drain electrode
120: gate insulation layer
130: oxide semiconductor layer
132: second oxide semiconductor layer
150: source electrode
180: light blocking layer

[EXPLANATION OF REFERENCE]

250: bank layer
271, 381: first electrode
273, 383: second electrode
341, 342: color filter
382: liquid crystal layer
270: organic light emitting device
272: organic layer
310: opposite substrate
350: light blocking part
300, 400: display apparatus

The invention claimed is:

1. A thin film transistor (TFT) comprising:
an oxide semiconductor layer on a substrate;
a gate electrode insulated from the oxide semiconductor layer to overlap at least a portion of the oxide semiconductor layer;
a source electrode connected to the oxide semiconductor layer; and
a drain electrode spaced apart from the source electrode and connected to the oxide semiconductor layer,
wherein the oxide semiconductor layer comprises a first oxide semiconductor layer on the substrate and a second oxide semiconductor layer on the first oxide semiconductor layer,
the first oxide semiconductor layer comprises nitrogen of 1 at % to 5 at % concentration with respect to number of atoms, and
the second oxide semiconductor layer has a nitrogen concentration which is lower than a nitrogen concentration of the first oxide semiconductor layer and a gradient of the nitrogen concentration such that nitrogen concentration is lowered in a direction closer to the gate electrode.

2. The TFT of claim 1, wherein the first oxide semiconductor layer has a thickness of 3 nm to 50 nm.

3. The TFT of claim 1, wherein the first oxide semiconductor layer and the second oxide semiconductor layer are amorphous.

4. The TFT of claim 1, wherein
each of the first oxide semiconductor layer and the second oxide semiconductor layer comprises an indium (In)-nitrogen (N) bond,
a ratio of an In—N bond in the first oxide semiconductor layer is higher than a ratio of an In—N bond in the second oxide semiconductor layer,
the ratio of the In—N bond in the first oxide semiconductor layer denotes a ratio of elements bonded to N among In elements included in the first oxide semiconductor layer, and the ratio of the In—N bond in the second oxide semiconductor layer denotes a ratio of elements bonded to N among In elements included in the second oxide semiconductor layer.

5. The TFT of claim 1, further comprising:
a light blocking layer on the substrate; and
a buffer layer on the light blocking layer,
wherein the light blocking layer overlaps the oxide semiconductor layer.

6. A method of manufacturing a thin film transistor (TFT), the method comprising:
forming an oxide semiconductor layer on a substrate;
forming a gate electrode which is insulated from the oxide semiconductor layer and overlaps at least a portion of the oxide semiconductor layer;
forming a source electrode and a drain electrode each connected to the oxide semiconductor layer and spaced apart from each other,
wherein the forming of the oxide semiconductor layer comprises:
forming a first oxide semiconductor material layer on the substrate through a sputtering deposition process with oxygen gas and nitrogen gas provided in a chamber;
forming a second oxide semiconductor material layer on the first oxide semiconductor material layer through a sputtering deposition process with oxygen gas provided in the chamber; and
patterning the first oxide semiconductor material layer and the second oxide semiconductor material layer to form a first oxide semiconductor layer and a second oxide semiconductor layer,
wherein the first oxide semiconductor layer comprises nitrogen of 1 at % to 5 at % concentration with respect to number of atoms, and
the second oxide semiconductor layer has a nitrogen concentration which is lower than a nitrogen concentration of the first oxide semiconductor layer and a gradient of a the nitrogen concentration such that the nitrogen concentration is lowered in a direction closer to the gate electrode.

7. The method of claim 6, wherein
the forming of the first oxide semiconductor material layer comprises supplying an argon gas, an oxygen gas, and a nitrogen gas to the chamber, and
a flow rate of the nitrogen gas supplied to the chamber is 1% to 50% of a flow rate of all gases supplied to the chamber.

8. The method of claim 6, wherein the first oxide semiconductor layer is formed to have a thickness of 3 nm to 50 nm.

9. The method of claim 6, further comprising:
before the forming of the oxide semiconductor layer,
forming a light blocking layer on the substrate; and
forming a buffer layer on the light blocking layer.

10. A display apparatus comprising:
a substrate;
a thin film transistor (TFT) on the substrate; and
a first electrode connected to the TFT,
wherein the TFT comprises:
an oxide semiconductor layer on the substrate;
a gate electrode insulated from the oxide semiconductor layer to overlap at least a portion of the oxide semiconductor layer;
a source electrode connected to the oxide semiconductor layer; and
a drain electrode spaced apart from the source electrode and connected to the oxide semiconductor layer,
wherein the oxide semiconductor layer comprises a first oxide semiconductor layer on the substrate and a second oxide semiconductor layer on the first oxide semiconductor layer,
the first oxide semiconductor layer comprises nitrogen of 1 at % to 5 at % concentration with respect to number of atoms, and
the second oxide semiconductor layer has a nitrogen concentration which is lower than a nitrogen concentration of the first oxide semiconductor layer and a gradient of the nitrogen concentration such that the nitrogen concentration is lowered in a direction closer to the gate electrode.

11. A thin film transistor (TFT) comprising:
an oxide semiconductor layer on a substrate, a first nitrogen concentration at a first point within the oxide semiconductor layer being higher than a second nitrogen concentration at a second point within the oxide semiconductor layer;
a gate electrode insulated from the oxide semiconductor layer and overlapping at least a portion of the oxide semiconductor layer, the first point within the oxide semiconductor layer being farther from the gate electrode than the second point within the oxide semiconductor layer is from the gate electrode;
a source electrode electrically connected to the oxide semiconductor layer; and
a drain electrode spaced apart from the source electrode and electrically connected to the oxide semiconductor layer,
wherein the nitrogen concentration is reduced toward the gate electrode at a first gradient at the first point within the oxide semiconductor layer, and the nitrogen concentration is reduced toward the gate electrode at a second gradient smaller than the first gradient at the second point within the oxide semiconductor layer.

12. The TFT of claim 11, wherein nitrogen concentration within the oxide semiconductor layer is reduced in at least a portion of the oxide semiconductor layer as a distance to the gate electrode becomes shorter.

13. The TFT of claim 11, wherein nitrogen concentration is reduced toward the gate electrode at a third gradient smaller than the first gradient at a third point within the oxide semiconductor layer, the third point within the oxide semiconductor layer being farther from the gate electrode than the first point within the oxide semiconductor layer is from the gate electrode, and
wherein a third nitrogen concentration at the third point within the oxide semiconductor layer is higher than the first nitrogen concentration at the first point within the oxide semiconductor layer.

14. The TFT of claim 13, wherein the oxide semiconductor layer comprises a first oxide semiconductor layer on the substrate and a second oxide semiconductor layer on the first oxide semiconductor layer, the third point being included in the first oxide semiconductor layer and the first point and the second point being included in the second oxide semiconductor layer.

15. The TFT of claim 14, wherein the first oxide semiconductor layer comprises nitrogen of 1 at % to 5 at % concentration with respect to number of atoms, and the nitrogen concentration of the second oxide semiconductor layer is lower than the nitrogen concentration of the first oxide semiconductor layer.

16. The TFT of claim 14, wherein the first oxide semiconductor layer has a thickness of 3 nm to 50 nm.

17. The TFT of claim 14, wherein the first oxide semiconductor layer and the second oxide semiconductor layer are amorphous.

18. The TFT of claim 14, wherein:
each of the first oxide semiconductor layer and the second oxide semiconductor layer comprises an indium (In)-nitrogen (N) bond,
a ratio of In—N bond in the first oxide semiconductor layer is higher than a ratio of In—N bond in the second oxide semiconductor layer,
the ratio of the In—N bond in the first oxide semiconductor layer denotes a ratio of elements bonded to N among In elements included in the first oxide semiconductor layer, and
the ratio of the In—N bond in the second oxide semiconductor layer denotes a ratio of elements bonded to N among In elements included in the second oxide semiconductor layer.

19. The TFT of claim 11, further comprising a light blocking layer between the substrate and the oxide semiconductor layer, the light blocking layer overlapping the oxide semiconductor layer.

20. A display apparatus comprising:
the TFT according to claim 11; and
an organic light emitting device electrically connected to the TFT.

21. A display apparatus comprising:
the TFT according to claim 11; and
a pixel electrode for driving a liquid crystal pixel electrically connected to the TFT.

* * * * *